(12) United States Patent
Jeong et al.

(10) Patent No.: US 8,948,304 B2
(45) Date of Patent: Feb. 3, 2015

(54) APPARATUS AND METHOD FOR TRANSMITTING AND RECEIVING DATA IN A COMMUNICATION OR BROADCASTING SYSTEM USING LINEAR BLOCK CODE

(75) Inventors: Hong-Sil Jeong, Seoul (KR); Hyun-Koo Yang, Seoul (KR); Sung-Ryul Yun, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 445 days.

(21) Appl. No.: 13/219,048

(22) Filed: Aug. 26, 2011

(65) Prior Publication Data

US 2012/0051460 A1    Mar. 1, 2012

(30) Foreign Application Priority Data

Aug. 26, 2010 (KR) .................. 10-2010-0083190
Oct. 7, 2010 (KR) .................. 10-2010-0098007

(51) Int. Cl.
*H04L 27/36* (2006.01)
*H04L 27/34* (2006.01)
*H03M 13/11* (2006.01)
*H03M 13/25* (2006.01)
*H03M 13/27* (2006.01)
*H03M 13/35* (2006.01)
*H04L 1/00* (2006.01)

(52) U.S. Cl.
CPC ........... *H04L 27/34* (2013.01); *H03M 13/1165* (2013.01); *H03M 13/255* (2013.01); *H03M 13/2707* (2013.01); *H03M 13/271* (2013.01); *H03M 13/356* (2013.01); *H04L 1/0041* (2013.01); *H04L 1/0058* (2013.01)
USPC ........... 375/298; 375/261; 375/295; 332/103; 708/531

(58) Field of Classification Search
USPC ............ 375/298, 261, 295; 332/103; 708/531
See application file for complete search history.

(56) References Cited

U.S. PATENT DOCUMENTS

| 5,946,328 | A | 8/1999 | Cox et al. | |
|---|---|---|---|---|
| 2005/0180525 | A1 | 8/2005 | Hansen et al. | |
| 2005/0204251 | A1* | 9/2005 | Moon et al. | 714/748 |
| 2009/0115647 | A1 | 5/2009 | Mittelholzer | |
| 2009/0125781 | A1* | 5/2009 | Jeong et al. | 714/752 |
| 2010/0325512 | A1* | 12/2010 | Yokokawa et al. | 714/752 |

FOREIGN PATENT DOCUMENTS

| EP | 2 178 214 | | 4/2010 |
|---|---|---|---|
| WO | WO 2009/069618 | * | 6/2009 |

* cited by examiner

*Primary Examiner* — Leila Malek
(74) *Attorney, Agent, or Firm* — The Farrell Law Firm, P.C.

(57) ABSTRACT

Provided is a method for transmitting data in a communication or broadcasting system using a linear block code by generating a codeword by encoding input information data bits, interleaving the codeword; outputting modulation signal-constituting bits by bit-mapping the interleaved codeword using a bit-mapping table predetermined depending on a modulation scheme and a coding rate, outputting a modulation signal by modulating the modulation signal-constituting bits and transmitting the modulation signal via a transmit antenna.

16 Claims, 12 Drawing Sheets

$$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

APPARATUS AND METHOD FOR TRANSMITTING AND RECEIVING DATA IN A COMMUNICATION OR BROADCASTING SYSTEM USING LINEAR BLOCK CODE

PRIORITY

This application claims priority under 35 U.S.C. §119(a) to Korean Patent Applications No. 10-2010-0083190 and No. 10-2010-0098007, which were filed in the Korean Intellectual Property Office on Aug. 26, 2010 and Oct. 7, 2010, respectively, the entire disclosures of which are incorporated herein by reference.

BACKGROUND OF THE INVENTION

1. Field of the Invention

The present invention relates generally to an apparatus and method for transmitting and receiving data in a communication or broadcasting system, and more particularly, to an apparatus and method for transmitting and receiving data in a communication or broadcasting system using linear block codes.

2. Description of the Related Art

Generally, a communication or broadcasting system transmits and receives data with data generated in an information source of a transmitter wirelessly transmitted over a channel after undergoing source coding, channel coding, interleaving and modulation and a receiver receives the wirelessly transmitted signals, and performs demodulation, deinterleaving, channel decoding and source decoding on the received signals.

In communication or broadcasting systems, signals may be distorted due to channel noises, channel fading, and Inter-Symbol Interference (ISI). Technology for overcoming signal distortion caused by noises, fading and ISI is essential, especially for high-speed digital communication or broadcasting systems requiring high data throughput and high reliability, such as the next-generation mobile communication systems, digital broadcasting systems, and mobile Internet systems. Channel coding and interleaving are typical examples of this technology.

Interleaving is used to distribute the parts where transmission bits are damaged, without concentrating them in one place, so as to minimize the data transmission loss by preventing burst errors that often occur while the data passes through fading channels, and to improve the effects of the channel coding described below.

Channel coding is widely used as a method for increasing reliability of communication by allowing a receiver to check signal distortion caused by the noises, fading and ISI and to recover the signal distortion efficiently. Codes used for channel coding and corrections are called Error-Correcting Codes (ECCs) and research into various types of ECCs has been conducted.

The commonly known linear block codes may include a Low Density Parity Check (LDPC) code. The present invention is described below with reference to the LDPC code, among the linear block codes.

The LDPC code is generally defined as a parity check matrix, and may expressed using a bipartite graph called a Tanner graph. The bipartite graph means that vertices constituting the graph are divided into two different types. The LDPC code is expressed in a bipartite graph including vertexes called variable nodes and check nodes. The variable nodes correspond to coded bits on a one-to-one basis.

Graphical representation of the LDPC code is described below with reference to FIGS. 1 and 2.

FIG. 1 is a diagram illustrating a parity check matrix $H_1$ of an LDPC code, in which the parity check matrix has four rows and eight columns. The matrix in FIG. 1 represents an LDPC code that generates a codeword having a length of 8, as it has eight columns. A relationship between the parity check matrix $H_1$ and an 8-bit codeword $c=[c_0,c_1,c_2,c_3,c_4,c_5,c_6,c_7]$ is defined as Equation (1) below.

$$H \cdot c^T = 0$$

$$c_0 \cdot h_0 + c_1 \cdot h_1 + c_2 \cdot h_2 + c_3 \cdot h_3 + c_4 \cdot h_4 + c_5 \cdot h_5 + c_6 \cdot h_6 + c_7 \cdot h_7 = 0 \quad (1)$$

In Equation (1), $h_0$, $h_1$, $h_2$, $h_3$, $h_4$, $h_5$, $h_6$, $h_7$ represent columns of the parity check matrix $H_1$, so each column of the parity check matrix may be associated with each codeword bit. That is, an i-th column $h_i$ of a parity check matrix is associated with an i-th bit $c_i$ of a codeword. Therefore, the number and positions of non-zero entries in each column $h_i$ are related to performance of a codeword bit $c_i$.

FIG. 2 is a diagram of a graph representation of a parity check matrix $H_1$ of an LDPC code. Specifically, FIG. 2 is a diagram illustrating a Tanner graph corresponding to the parity check matrix $H_1$ in FIG. 1. Referring to FIG. 2, the Tanner graph of the LDPC code includes eight variable nodes $x_1$ 202, $x_2$ 204, $x_3$ 206, $x_4$ 208, $x_5$ 210, $x_6$ 212, $x_7$ 214, and $x_8$ 216, and four check nodes 218, 220, 222, and 224. The i-th column and a j-th row of the parity check matrix $H_1$ of the LDPC code correspond to the variable node $x_i$ and the j-th check node, respectively. A value of 1 (or a non-zero value) at the point where the i-th column and the j-th row of the parity check matrix $H_1$ of the LDPC code cross each other, means that an edge exists between the variable node $x_i$ and the j-th check node on the Tanner graph as illustrated in FIG. 2.

In the Tanner graph of the LDPC code, degrees of variable nodes and check 5 nodes represent the number of edges connected between the nodes, which is the same as the number of non-zero entries in columns or rows corresponding to the associated nodes in the parity check matrix of the LDPC code. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216, are 4, 3, 3, 3, 2, 2, 2, and 2, respectively, and degrees of the check nodes 218, 220, 222, and 224 are 6, 5, 5, and 5, respectively. The numbers of non-zero entries in columns of the parity check matrix $H_1$ in FIG. 1, which correspond to the variable nodes in FIG. 2, are equal to the degrees 4, 3, 3, 3, 2, 2, 2, and 2, respectively, and the numbers of non-zero entries in rows of the parity check matrix $H_1$ in FIG. 1, which correspond to the check nodes in FIG. 2, are equal to the degrees 6, 5, 5, and 5, respectively.

As described above, the coded bits are related to columns of the parity check matrix, and correspond to even variable nodes in the Tanner graph on a one-to-one basis. The degrees of the variable nodes, which correspond to the coded bits on a one-to-one basis, are called degrees of the encoded bits.

As to the LDPC code, it is known that codeword bits having higher degrees are superior in decoding performance to codeword bits having lower degrees, because the high-degree variable nodes may acquire more information through iterative decoding, compared with the low-degree variable nodes. However, the performance of codeword bits may not be exactly determined based on only these characteristics. Other characteristics such as cycles of the variable nodes in the Tanner graph, which are mapped to the codeword bits on a one-to-one basis, should be considered.

FIG. 3 is a diagram illustrating a parity check matrix of an LDPC code, having a specific structure. The LDPC code is a code used in Digital Video Broadcasting-Satellite Second Generation (DVB-S2), Digital Video Broadcasting-Second Generation Terrestrial (DVB-T2), and Digital Video Broadcasting-Next Generation Handheld (DVB-NGH), which are European broadcasting systems. The LDPC code has a systematic structure, in which a codeword includes an information word (or an "information part"). Although the LDPC code is described below based on the parity check matrix in FIG. 3 for convenience of description, it is understood by those of ordinary skill in the art that the present invention is not limited to the parity check matrix in FIG. 3, or to DVB-S2, DVB-T2, and DVB-NGH.

Referring to FIG. 3, a parity check matrix includes an information part and a parity part. The information part includes $K_1$ columns, and the parity part includes $(N_1-K_1)$ columns. The number of rows of the parity check matrix is the same as the number $(N_1-K_1)$ of columns of the parity part.

$N_1$ represents a length of an LDPC codeword, $K_1$ represents a length of the information part, and $(N_1-K_1)$ represents a length of the parity part. The "length of a codeword" as used herein may refer to the number of bits constituting the codeword, and the "length of an information part" as used herein may refer to the number of bits constituting the information part. Integers $M_1$ and $q$ are determined to meet $q=(N_1-K_1)/M_1$, where $K_1/M_1$ may also be an integer.

In the parity check matrix illustrated in FIG. 3, positions having a weight of 1 (or weight-1 positions) in $K_1$-th to $(N_1-1)$-th columns corresponding to the parity bits, may form a dual-diagonal structure. Therefore, it is noted that degrees of the columns corresponding to the parity bits, except for the $(N_1-1)$-th column, are all 2, and a degree of the $(N_1-1)$-th column is 1.

Referring to FIG. 3, 0-th to $(K_1-1)$ columns corresponding to the information part of the parity check matrix may be generated according to the following rules.

Rule 1: A total of $K_1/M_1$ column groups are generated by grouping $K_1$ columns corresponding to the information part of the parity check matrix, by $M_1$. Columns in each column group may be generated according to the following Rule 2.

Rule 2: Positions of 1 in a 0-th column in an i-th column group (i=1, $K_1/M_1$) are determined. Assuming that a degree of a 0-th column in each i-th column group is represented by $D_i$ and positions of rows with a value of 1 are represented by $R_{i,0}^{(1)}, R_{i,0}^{(2)}, \ldots, R_{i,0}^{(D_i)}$, positions $R_{i,j}^{(k)}$ for (k=1,2,…,$D_i$) of rows with a value of 1 in a j-th (j=1, 2, …, $M_1$−1) column in an i-th column group may be defined as shown in Equation (2) below:

$$R_{i,j}^{(k)}=R_{i,(j-1)}^{(k)}+q \bmod(N_1-K_1)$$

$$k=1,2,\ldots,D_i, i=1,\ldots,K_1/M_1, j=1,\ldots,M_1-1 \quad (2)$$

In accordance with Rules 1 and 2, it is noted that degrees of columns in an i-th column group (i=1, $K_1/M_1$) are all constant to $D_i$. A specific example is considered below, for a better understanding of a structure of an LDPC code, which stores information about the parity check matrix according to the above rules.

As a specific example, it is assumed that $N_1$=30, $K_1$=15, $M_1$=5 and q=3, and position information of rows with a value of 1 in 0-th columns in three column groups may be represented in the following sequences. These sequences are referred to as "weight-1 position sequences".

$R_{1,0}^{(1)}$=1, $R_{1,0}^{(2)}$=2, $R_{1,0}^{(3)}$=8, $R_{1,0}^{(4)}$=10,
$R_{2,0}^{(1)}$=0, $R_{2,0}^{(2)}$=9, $R_{2,0}^{(3)}$=13,
$R_{3,0}^{(1)}$=0, $R_{3,0}^{(2)}$=14.

As for the weight-1 position sequences for the positions of rows with a value of 1 in 0-th columns in column groups, only the sequences for their column groups may be represented as follows, for convenience.

1 2 8 10
0 9 13
0 14

That is, the i-th weight-1 position sequences represent position information of rows with a value of 1 in i-th column groups, respectively.

The LDPC code has been described so far. Signal constellation in a communication or broadcasting system to which a Quadrature Amplitude Modulation (QAM) scheme, the commonly used high-order modulation scheme, is applied, is described below. QAM-modulated symbols are divided into a real part and an imaginary part, and various different modulation symbols may be generated by changing sizes and signs of the real part and the imaginary part. Quadrature Phase Shift Keying (QPSK) modulation scheme is described together, in order to find out the characteristics of QAM.

FIG. 4A is a diagram illustrating a general signal constellation of a QPSK modulation scheme.

Referring to FIG. 4A, $y_0$ determines a sign of the real part and $y_1$ determines a sign of the imaginary part. That is, a sign of the real part is plus (+) for $y_0$=0, and minus (−) for $y_0$=1, and a sign of the imaginary part is plus (+) for $y_1$=0, and minus (−) for $y_1$=1. In the QPSK modulation scheme, $(y_0, y_1)$ bits corresponding to one modulation signal are the same in reliability because $y_0$ and $y_1$ are the same in error rate as they are sign indication bits representing signs of the real part and the imaginary part. For $y_{0,q}$ and $y_{1,q}$, the second subscript index q indicates a q-th output of modulation signal-constituting bits.

FIG. 4B is a diagram illustrating a general signal constellation of a 16-QAM modulation scheme.

Referring to FIG. 4B, $(y_0, y_1, y_2, y_3)$ bits corresponding to one modulation signal have the following meanings. Bits $y_0$ and $y_2$ determine sign and magnitude of the real part, respectively, and bits $y_1$ and $y_3$ determine sign and magnitude of the imaginary part, respectively. That is, $y_0$ and $y_1$ determine signs of the real part and the imaginary part of the signal, and $y_2$ and $y_3$ determine magnitudes of the real part and the imaginary part of the signal. Because determining signs of the modulation signal is easier than determining magnitudes of the modulation signal, $y_2$ and $y_3$ are higher in error rate than $y_0$ and $y_1$. Therefore, for the $(y_0, y_1, y_2, y_3)$ bits, their no-error rates or reliabilities are in order of $R(y_0)=R(y_1)>R(y_2)=R(y_3)$. $R(y)$ represents reliability of a bit y. Unlike QPSK modulation signal-constituting bits, QAM modulation signal-constituting bits $(y_0, y_1, y_2, y_3)$ are different in reliability.

In the 16-QAM modulation scheme, order and roles of the $(y_0, y_1, y_2, y_3)$ bits are subject to change because two bits among the four bits constituting a signal determine signs of the real part and the imaginary part of the signal, and the other two bits determine magnitudes of the real part and the imaginary part of the signal.

FIG. 4C is a diagram illustrating a general signal constellation of a 64-QAM modulation scheme.

Referring to FIG. 4C, among $(y_0, y_1, y_2, y_3, y_4, y_5)$ bits corresponding to one modulation signal, bits $y_0$, $y_2$ and $y_4$ determine sign and magnitude of the real part, and bits $y_1$, $y_3$ and $y_5$ determine sign and magnitude of the imaginary part. The bits $y_0$ and $y_1$ determine signs of the real part and the imaginary part, respectively, and the bits $y_2$ and $y_3$ and the bits $y_4$ and $y_5$ determine magnitudes of the real part and the imaginary part, respectively. Because determining signs of the modulation signal is easier than determining magnitudes of the modulation signal, $y_0$ and $y_1$ are higher in reliability than $y_2$, $y_3$, $y_4$ and $y_5$. The bits $y_2$ and $y_3$ are determined depending on whether a magnitude of the modulated symbol is greater than or less than 4, and the bits $y_4$ and $y_5$ are determined depending on whether a magnitude of the modulated symbol is closer to 4 or 0 from 2, or whether a magnitude of the modulated symbol is closer to 4 or 8 from 6. Therefore, a range for determining $y_2$ and $y_3$ is 4, while a range for determining $y_4$ and $y_5$ is 2. Thus, $y_2$ and $y_3$ are higher than $y_4$ and $y_5$ in reliability. In summary, for the ($y_0$, $y_1$, $y_2$, $y_3$, $y_4$, $y_5$) bits, their no-error rates or reliabilities are in order of $R(y_0)=R(y_1)>R(y_2)=R(y_3)>R(y_4)=R(y_5)$.

In the 64-QAM modulation scheme, among the six bits constituting a signal, two bits determine signs of the real part and the imaginary part of the signal, and four bits determine magnitudes of the real part and the imaginary part of the signal. Therefore, order and roles of the ($y_0$, $y_1$, $y_2$, $y_3$, $y_4$, $y_5$) bits are subject to change.

Although not illustrated in the drawing, even in the signal constellation of a modulation scheme of 256-QAM or more, roles and reliabilities of modulation signal-constituting bits are subject to change in the same manner as described above. That is, for ($y_0$, $y_1$, $y_2$, $y_3$, $y_4$, $y_5$, $y_6$, $y_7$) bits corresponding to one modulation signal, their no-error rates or reliabilities are in order of $R(y_0)=R(y_1)>R(y_2)=R(y_3)>R(y_4)=R(y_5)>R(y_6)=R(y_7)$.

Conventionally, however, in performing interleaving/deinterleaving, a communication or broadcasting system using an LDPC code uses any interleaving/deinterleaving scheme regardless of the reliability characteristics of the LDPC code or modulation signal-constituting bits of high-order modulation, or uses interleaving/deinterleaving and signal constellation bit-mapping scheme in which only degrees of variable nodes or check nodes of the LDPC code are considered, making it difficult to minimize distortion of signals transmitted over a channel.

One system may use a plurality of parity check matrixes to support a plurality of coding rates. Here, the coding rates have different degree distribution characteristics, so the signal constellation bit-mapping scheme should be different according to the change in the degree distribution characteristic. However, an increase in the number of bit-mapping scheme in use may increase complexity of the system, so there is a need for a method capable of using the same bit-mapping scheme if possible.

SUMMARY OF THE INVENTION

Accordingly, the present invention has been made to solve the above-mentioned problems occurring in the prior art, and the present invention provides a data transmission/reception apparatus and method for reducing signal distortion in a communication system using a parity check matrix.

According to an aspect of the present invention, there is provided an interleaving apparatus and method for improving performance of an LDPC codeword in a communication system using a parity check matrix.

According to yet another aspect of the present invention there is provided a signal constellation bit-mapping apparatus and method for improving performance of an LDPC codeword in a communication system using a parity check matrix.

In accordance with one aspect of the present invention, there is provided a method for transmitting data in a communication or broadcasting system using a linear block code. The method includes generating a codeword by encoding input information data bits; interleaving the codeword; outputting modulation signal-constituting bits by bit-mapping the interleaved codeword using a bit-mapping table predetermined depending on a modulation scheme and a coding rate; outputting a modulation signal by modulating the modulation signal-constituting bits; and transmitting the modulation signal via a transmit antenna.

In accordance with another aspect of the present invention, there is provided an apparatus for transmitting data in a communication or broadcasting system using a linear block code. The apparatus includes an encoder for generating a codeword by encoding input information data bits; an interleaver for interleaving the codeword; a bit mapper for outputting modulation signal-constituting bits by bit-mapping the interleaved codeword using a bit-mapping table predetermined depending on a modulation scheme and a coding rate; a modulator for outputting a modulation signal by modulating the modulation signal-constituting bits; and a transmitter for transmitting the modulation signal via a transmit antenna.

In accordance with further another aspect of the present invention, there is provided a method for receiving data in a communication or broadcasting system using a linear block code. The method includes receiving a signal transmitted by a transmitter; demodulating the received signal; bit-demapping the demodulated signal using a bit-mapping table predetermined depending on a modulation scheme and a coding rate of the transmitter; deinterleaving the bit-demapped bits; and decoding the deinterleaved bits. The signal transmitted by the transmitter is a signal generated by outputting modulation signal-constituting bits by bit-mapping an interleaved codeword, and then modulating the modulation signal-constituting bits.

In accordance with yet another aspect of the present invention, there is provided an apparatus for receiving data in a communication or broadcasting system using a linear block code. The apparatus includes a receiver for receiving a signal transmitted by a transmitter; a demodulator for demodulating the received signal; a bit demapper for bit-demapping the demodulated signal using a bit-mapping table predetermined depending on a modulation scheme and a coding rate of the transmitter; a deinterleaver for deinterleaving the bit-demapped bits; and a decoder for decoding the deinterleaved bits. The signal transmitted by the transmitter is a signal generated by outputting modulation signal-constituting bits by bit-mapping an interleaved codeword, and then modulating the modulation signal-constituting bits.

BRIEF DESCRIPTION OF THE DRAWINGS

The above and other aspects, features and advantages of various embodiments of the present invention will be more apparent from the following description taken in conjunction with the accompanying drawings, in which.

Throughout the drawings, the same drawing reference numerals may refer to the same elements, features and structures.

DETAILED DESCRIPTION OF THE EMBODIMENTS OF THE PRESENT INVENTION

Various embodiments of the present invention will be described in detail with reference to the accompanying drawings. In the following description, specific details such as detailed configuration and components are merely provided to assist the overall understanding of various embodiments of the present invention. Therefore, it should be apparent to those of ordinary skill in the art that various changes and modifications of the embodiments described herein can be made without departing from the scope and spirit of the invention. In addition, descriptions of well-known functions and constructions are omitted for clarity and conciseness.

Figure 5:
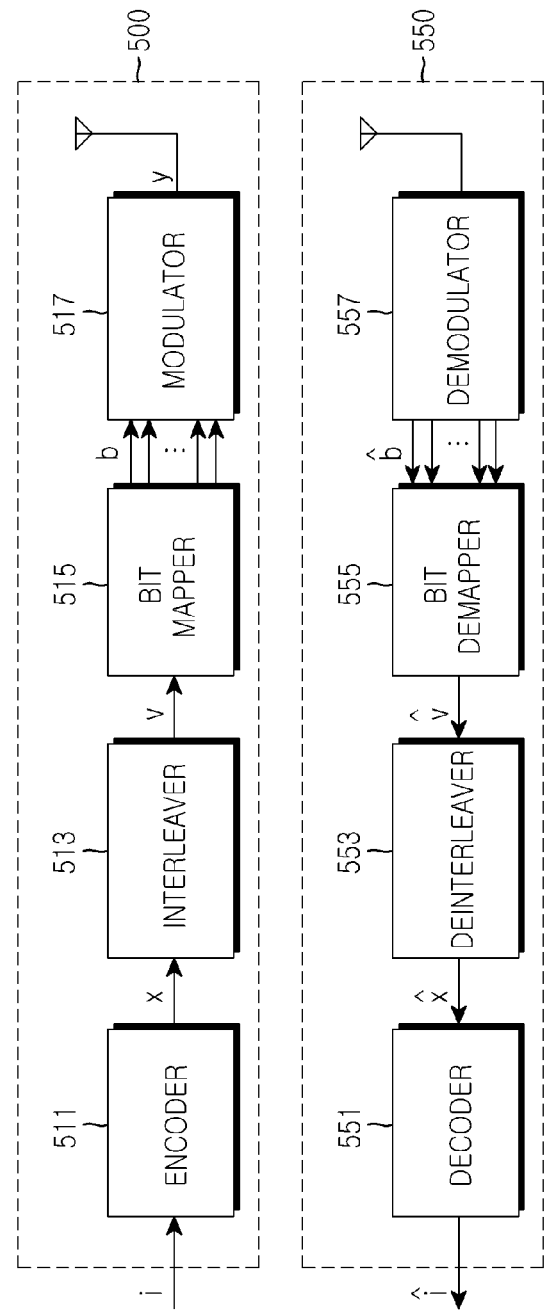
FIG. 5 is a diagram illustrating a configuration of a communication or broadcasting system using a parity check matrix of an LDPC code according to an embodiment of the present invention.

FIG. 5 is a diagram illustrating configuration of a communication or broadcasting system using a parity check matrix of an LDPC code according to an embodiment of the present invention.

Referring to FIG. 5, a transmitter 500 includes an encoder 511, an interleaver 513, a signal-to-constellation bit-mapping (or bit-mapping into constellation) unit (hereinafter referred to as a "bit mapper") 515, and a modulator 517. A receiver 550 includes a demodulator 557, a signal-to-constellation bit-demapping (hereinafter referred to as a "bit demapper") 555, a deinterleaver 553, and a decoder 551.

Operations of the transmitter and receiver according to the present invention are briefly described with reference to FIG. 5, and structures and operations of the interleaver and bit mapper according to the present invention are described in detail with reference to FIGS. 6A to 6D.

If an information data bit stream $I=[i_0, i_1, i_2, \ldots, i_{k-1}]$ is input to the transmitter 500, I is delivered to the encoder 511, and the encoder 511 generates a codeword $c=[c_0, c_0, \ldots, c_{n-1}]$ by encoding the information data bits using a specific coding scheme, and outputs the codeword c to the interleaver 513. A coding rate of the code is k/n. Although the transmitter and receiver is described below in terms of a codeword, they will now be limited to the codeword. That is, bit-based coding corresponds to coding that is performed in units of columns of a parity check matrix.

The interleaver 513 interleaves the codeword output from the encoder 511 using a specific interleaving scheme, and outputs the interleaved codeword to the bit mapper 515. An interleaving operation of the interleaver 513 is performed according to an interleaving scheme according to the present invention. The interleaving scheme is described in detail below.

The bit mapper 515 performs signal constellation bit-mapping on the bits output from the interleaver 513 or the interleaved LDPC codeword v using a specific mapping scheme, and outputs the mapping results to the modulator 517. A mapping operation of the bit mapper 515 is performed according to a mapping scheme according to the present invention. The mapping scheme is a scheme for mapping input bits to the bits constituting a modulation symbol depending on the degree distribution characteristics of the codeword v, and a detailed description thereof is given below.

The modulator 517 modulates the signal output from the bit mapper 515 using a specific modulation scheme, and transmits the modulated signal via a transmit antenna Tx.Ant. The interleaver 513 and the bit mapper 515 increase interleaving and bit-mapping performances by performing interleaving and bit-mapping so that the modulator 517 may minimize a Bit Error Rate (BER) or a Frame Error Rate (FER) in modulating the codeword v.

The interleaver 513 and the bit mapper 515 are designed such that a relationship between codeword bits (or an input signal to the interleaver 513) and modulation signal-constituting bits (or an output signal of the bit mapper 515) may meet the following rules. It is assumed that the number of codeword bits is n and a $2^{2m}$-QAM modulation scheme is used.

Rule 3: A different bit-mapping scheme is used depending on the ratio of the lowest-degree bits.

Rule 4: The highest-degree bits are generated with the lowest-reliability modulation signal-constituting bits, when the ratio of the lowest-degree bits is high.

Rule 5: A cycle between codeword bits constituting the same modulation signal is set greatest if possible.

Rule 6: A method for changing a bit-mapping scheme or positions of columns of a parity check matrix is considered so as to use the same bit-mapping method if possible, when using multiple parity check matrixes.

In Rule 3, at each coding rate, its optimal mapping method should be used, causing inconvenience. Therefore, a minimum number of bit-mapping schemes may be used by considering a method capable of optimizing the mapping method while changing positions of columns in an information part of a parity check matrix like in Rule 6.

Regarding Rule 5, in determining a demultiplexer (DE-MUX) in FIGS. 6A to 6D, the transmitter first determines whether input bits to the DEMUX will be mapped to Most Significant Bit (MSB) bits having high reliability of the modulation signal, or to Least Significant Bit (LSB) bits having low reliability of the modulation signal, and then considers a cycle between codeword bits when selecting bits from among the multiple MSB bits of the modulation signal.

Decoding performance of the LDPC codeword may be improved by establishing the relationship between LDPC codeword bits and the modulation signal-constituting bits. The most important feature of the above rules is to consider degree distribution of the parity check matrix unlike in the conventional scheme, and to consider a mapping method while changing positions of columns of the parity check matrix in order to use a minimum number of mapping methods while considering the optimal performance. The degree distribution of the parity check matrix is subject to change depending on the coding rate and the code length.

The mapping scheme, to which the above rules are applied, may achieve excellent performance for the following reasons.

Although low-degree bits in an LDPC code have a low ability of correcting errors in a decoding process, their performance may be improved by mapping them to high-reliability modulation signal-constituting bits. However, if all of the low-degree bits are mapped to the high-reliability modulation signal-constituting bits, all higher-degree bits should be mapped to low-reliability modulation signal-constituting bits, causing an increase in the influence of the low-reliability bits. Therefore, the performance may be improved by mapping only some of the low-degree bits to the high-reliability modulation signal-constituting bits, instead of mapping all of the low-degree bits to the high-reliability modulation signal-constituting bits. However, mapping the low-degree bits only to the low-reliability modulation signal-constituting bits may cause significant degradation in error correction capability of the low-degree bits, leading to possible occurrence of an error floor. Therefore, the ratio of the low-degree bits to be mapped to the low-reliability modulation signal-constituting bits to the total low-degree bits should be carefully chosen, and may be different depending on the degree distribution of the parity check matrix.

The receiver 550 receives signals transmitted from the transmitter 500, and outputs the signals having undergone a reverse process of the transmitter 500. That is, a signal received at the receiver 550 via a receive antenna Rx.Ant is delivered to the demodulator 557. The demodulator 557 demodulates the received signal using a demodulation scheme corresponding to the modulation scheme of the modulator 517 in the transmitter 500, and outputs the demodulated signal to the bit demapper 555. The bit demapper 555 bit-demaps the signal output from the demodulator 557 based on the mapping scheme performed by the bit mapper 515 in the transmitter 500, and outputs the bit-demapped signal to the deinterleaver 553. The deinterleaver 553 deinterleaves the signal output from the bit demapper 555 based on the interleaving scheme applied by the interleaver 513 in the transmitter 500, and outputs the deinterleaved signal to the decoder 551. The decoder 551 decodes the deinterleaved signal using a decoding scheme corresponding to the coding scheme applied by the encoder 511 in the transmitter 500, restoring the received signal to the final information data bits.

In FIG. 5, the signal output from the modulator 517 is transmitted via the transmit antenna Tx.Ant after undergoing Radio Frequency (RF) processing in a separate RF transmitter (not shown) for RF signal transmission. Likewise, the signal received at the receive antenna Rx.Ant is input to the demodulator 557 after undergoing RF processing in an RF receiver (not shown) for RF signal reception.

The transmitter 500 features the interleaver 513 and the bit mapper 515 that use the unequal reliability characteristics of the high-order modulation scheme, and the receiver 550 features the deinterleaver 553 and the bit demapper 555 that use the unequal reliability characteristics of the high-order modulation scheme. Operations of the interleaver and the signal constellation bit-mapping unit according to the present invention in FIG. 5 are described in detail below with reference to FIGS. 6A to 6D.

FIGS. 6A to 6D illustrate structures of an interleaver and a signal constellation bit-mapping unit according to an embodiment of the present invention.

Figure 6A:
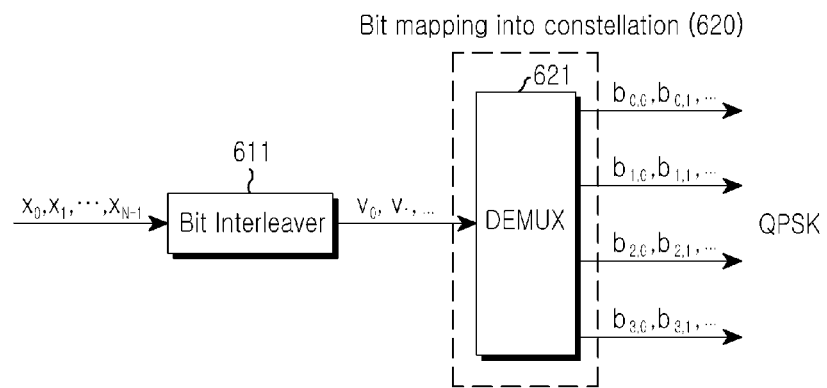
FIGS. 6A to 6D illustrate structures of an interleaver and a signal constellation bit-mapping unit according to an embodiment of the present invention.
Figure 6B:
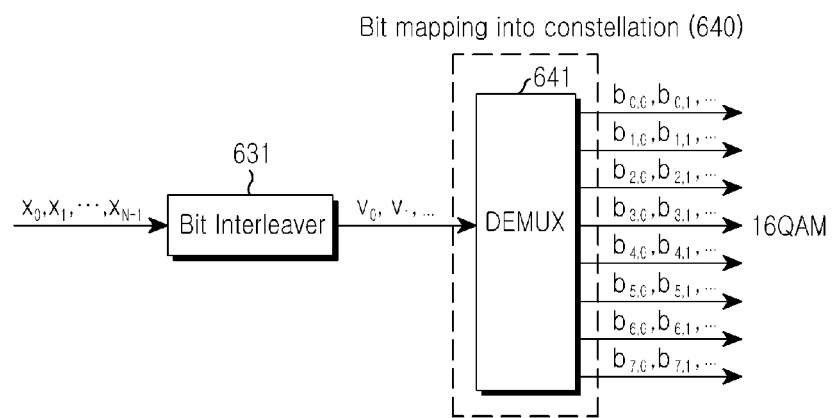
Figure 6C:
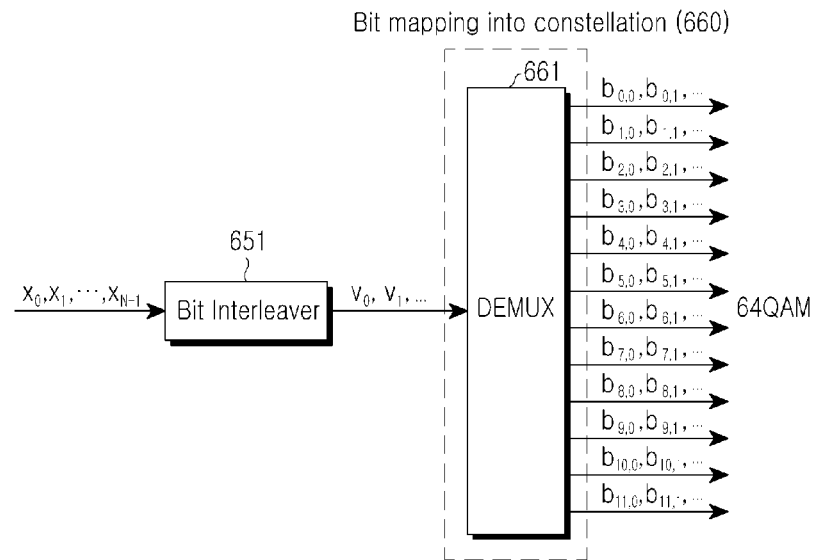
Figure 6D:
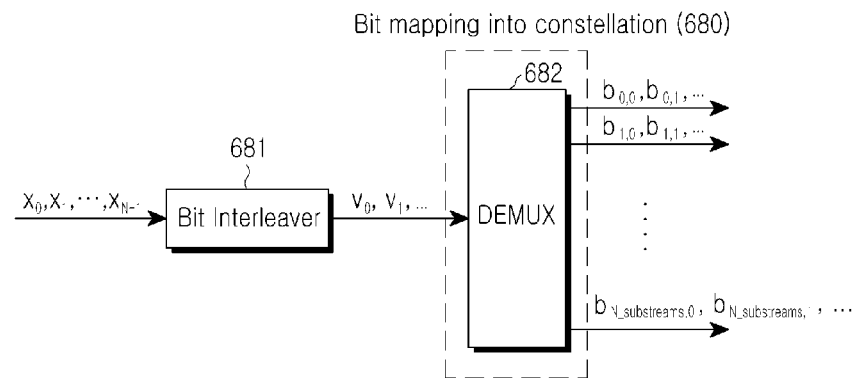

As illustrated in FIGS. 6A to 6D, the bit mapper 515 in FIG. 5 may include a DEMUX. FIG. 6A is a diagram illustrating a bit-mapping scheme using QPSK modulation signals. FIG. 6B is a diagram illustrating a bit-mapping scheme using 16-QAM modulation signals. FIG. 6C is a diagram illustrating a bit-mapping scheme using 64-QAM modulation signals. FIG. 6D is a diagram illustrating a bit-mapping scheme using arbitrary modulation signals. The four different bit-mapping schemes is described below together below.

If an encoded signal x is input to bit interleavers (hereinafter referred to as "interleavers" for short) 611, 631, 651 and 681 corresponding to their associated modulation schemes, the interleavers 611, 631, 651 and 681 output interleaved signals v by interleaving the encoded signal x. The interleaved signals v are input to their associated DEMUXs 621, 641, 661 and 682, in which they are separated into multiple streams. That is, in FIG. 6A for QPSK, the interleaved signal v is separated into four streams. In FIG. 6B for 16-QAM, the interleaved signal v is separated into eight streams. In FIG. 6C for 64-QAM, the interleaved signal v is separated into twelve streams. That is, by the structures of FIGS. 6A, 6B and 6C, their input signals are interleaved according to associated interleaving schemes, and then separated into streams, two times the number of bits constituting the modulation signals. Compared to the method of generating as many streams as the number of bits constituting the modulation signals, this method may provide a variety of methods for mapping codeword bits to modulation signal-constituting bits, contributing to performance improvement.

Each of the DEMUXs 621, 641, 661 and 682 receives one stream and separates it into multiple streams, thereby generating bits of the modulation signal. In the present invention, it is important to determine which bits among the bits of the modulation signal the interleaved codeword will include. An operation of the DEMUX 641 using 16-QAM modulation signals as illustrated in FIG. 6B, among the DEMUXs 621, 641, 661 and 682, is described in detail below. An operation of the DEMUX 661 using 64-QAM modulation signals as illustrated in FIG. 6C will also be described in detail. Operations of the DEMUXs using other modulation signals are similar to that of the DEMUX 641 using 16-QAM modulation signals, so a description thereof is omitted.

LDPC codeword bits $c=[c_0, c_1, \ldots, c_{n-1}]$ are input to the interleaver 631. An interleaving scheme and a bit-mapping scheme of the modulation signal are determined taking into account both the degree distribution of LDPC codeword bits and the reliabilities of signal constellation bits. A detailed description thereof will now be provided.

Output bits $v=[v_0, v_1, \ldots, v_{n-1}]$ of the interleaver 631 are input to the DEMUX 641, in which they are demultiplexed into as many bits as the number of bits constituting the modulation signal. That is, in the 16-QAM modulation, since the modulation signal includes four bits, input bits of the DEMUX 641 are demultiplexed into 4*2=8 bits. The bit-mapping method is determined depending on the mapping relationship between eight consecutive input bits $v_0, v_1, \ldots, v_7$ and bits $b_0, b_1, b_2, b_3, b_4, b_5, b_6, b_7$ constituting the modulation signal. The interleaving scheme and the bit-mapping method according to the present invention are described in detail below. The interleaver and bit mapper according to the present invention have been designed based on the above-mentioned rules.

Figure 4A:
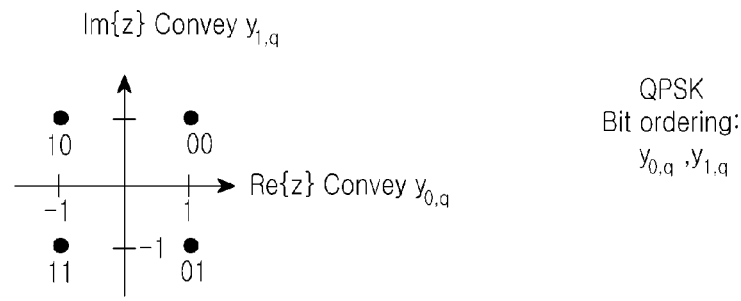
FIG. 4A is a diagram illustrating a general signal constellation of a QPSK modulation scheme.
Figure 4B:
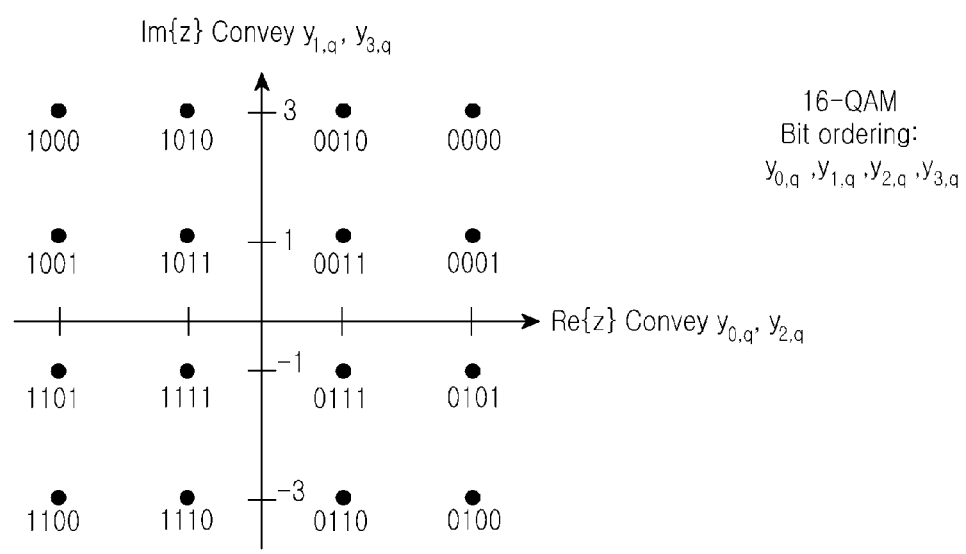
FIG. 4B is a diagram illustrating a general signal constellation of a 16-QAM modulation scheme.

In FIG. 6B, $b_{0,i}, b_{1,i}, b_{2,i}, b_{3,i}, b_{4,i}, b_{5,i}, b_{6,i}, b_{7,i}$ (for i=0, 1, . . . , n; where n represents the number of LDPC codeword bits) are mapped to $y_0, y_1, y_2, y_3$ of the 16-QAM modulation scheme in FIG. 4B. That is, $b_{0,i}, b_{1,i}, b_{2,i}, b_{3,i}$ constitute one 16-QAM modulation signal, and are mapped to $y_0, y_1, y_2, y_3$ ($b_{0,i}, b_{1,i}, b_{2,i}, b_{3,i} = y_0, y_1, y_2, y_3$), respectively, and $b_{4,i}, b_{5,i}, b_{6,i}, b_{7,i}$ constitute another 16-QAM modulation signal, and are mapped to $y_0, y_1, y_2, y_3$ ($b_{4,i}, b_{5,i}, b_{6,i}, b_{7,i} = y_0, y_1, y_2, y_3$), respectively. That is, among the output bits $b_{0,i}, b_{1,i}, b_{2,i}, b_{3,i}, b_{4,i}, b_{5,i}, b_{6,i}, b_{7,i}$ of the DEMUX 641, $b_{0,i}$ and $b_{2,i}$ constitute the real part of a 2i-th modulation signal, and $b_{1,i}$ and $b_{3,i}$ constitute the imaginary part of the 2i-th modulation signal. In addition, $b_{4,i}$ and $b_{6,i}$ constitute the real part of a (2i+1)-th modulation signal, and $b_{5,i}$ and $b_{7,i}$ constitute the imaginary part of the (2i+1)-th modulation signal.

In the 64-QAM modulation in FIG. 6C, since the modulation signal includes six bits, input bits of the DEMUX 661 are demultiplexed into 6*2=12 bits. The bit-mapping method is determined depending on the mapping relationship between twelve consecutive input bits $v_0, v_1, \ldots, v_{11}$ and bits $b_0, b_1, b_2, b_3, b_4, \ldots, b_{11}$ constituting the modulation signal. The interleaving scheme and the bit-mapping method according to the present invention are described in detail below. The interleaver and bit mapper according to the present invention have been designed based on the above-mentioned rules.

Figure 4C:
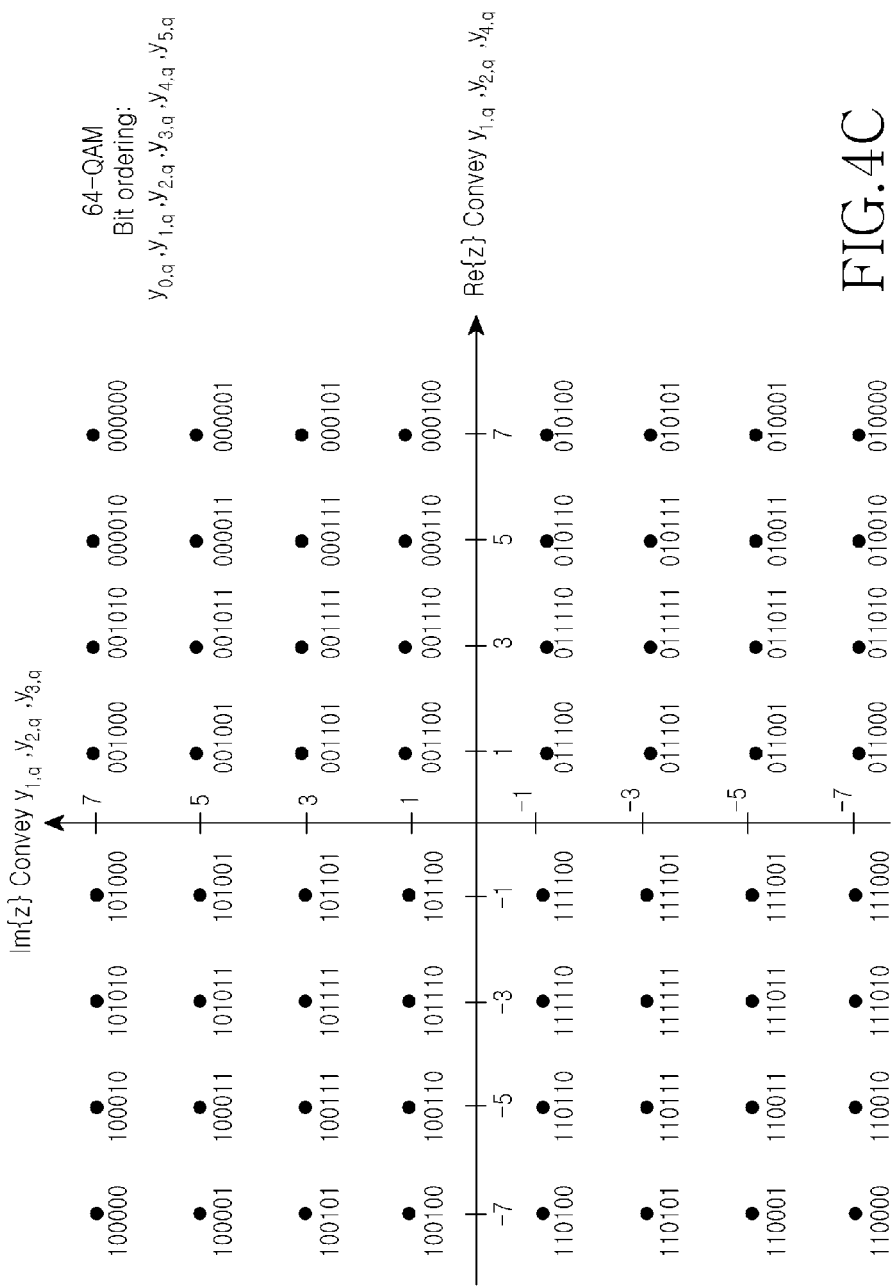
FIG. 4C is a diagram illustrating a general signal constellation of a 64-QAM modulation scheme.

In FIG. 6C, the output bits $b_{0,i}, b_{1,i}, b_{2,i}, b_{3,i}, b_{4,i}, b_{5,i}, b_{6,i}, b_{7,i}, b_{8,i}, b_{9,i}, b_{10,i}, b_{11,i}$ of the DEMUX 661 are mapped to bits $y_0, y_1, y_2, y_3, y_4, y_5$ of the 64-QAM modulation scheme in FIG. 4C. That is, $b_{0,i}, b_{1,i}, b_{2,i}, b_{3,i}, b_{4,i}, b_{5,i}$ constitute one 64-QAM modulation signal, and are mapped to $y_0, Y_1, Y_2, y_3, y_4, y_5$ ($b_{0,i}, b_{1,i}, b_{2,i}, b_{3,i}, b_{4,i}, b_{5,i} = y_0, y_1, y_2, y_3, y_4, y_5$), respectively, and $b_{6,i}, b_{7,i}, b_{8,i}, b_{9,i}, b_{10,i}, b_{11,i}$ constitute another 64-QAM modulation signal, and are mapped to $y_0, y_1, y_2, y_3, y_4, y_5$ ($b_{6,i}, b_{7,i}, b_{8,i}, b_{9,i}, b_{10,i}, b_{11,i} = y_0, y_1, y_2, y_3, y_4, y_5$), respectively. Among the output bits $b_{0,i}, b_{1,i}, b_{2,i}, b_{3,i}, b_{4,i}, b_{5,i}, b_{6,i}, b_{7,i}, b_{8,i}, b_{9,i}, b_{10,i}, b_{11,i}$ of the DEMUX 661, $b_{0,i}, b_{2,i}, b_{4,i}, b_{6,i}$ constitute the real part of a 2i-th modulation signal, and $b_{1,i}, b_{3,i}, b_{5,i}, b_{7,i}$ constitute the imaginary part of the 2i-th modulation signal. In addition, $b_{4,i}, b_{6,i}, b_{8,i}, b_{10,i}$ constitute the real part of a (2i+1)-th modulation signal, and $b_{5,i}, b_{7,i}, b_{9,i}, b_{11,i}$ constitute the imaginary part of the (2i+1)-th modulation signal.

A process of designing an interleaver according to an embodiment of the present invention is described below. The proposed interleaver design process of the present invention includes the following steps.

Step 1: The number of columns of the interleaver is determined to be two times the number of bits used in a modulation symbol, i.e., the number of modulation signal-constituting bits.

Step 2: A value obtained by dividing a codeword length by the number of columns, determined in Step 1, is determined as the number of interleaver rows.

Step 3: LDPC codeword bits are written in the size-determined interleaver column by column.

Step 4: Bits are read one by one from each of the columns in which codeword bits are written.

If codeword bits are written bit by bit in Step 3, the position of a starting column may be changed, in some of the rows.

Table 1 below shows the size (number) of rows and columns of interleavers based on the different modulation schemes, for n=16200 and 4320 (where n represents a codeword length).

TABLE 1

| Modulation | Number of rows | | Number of columns |
|---|---|---|---|
| | n = 16200 | n = 4320 | |
| QPSK | 4050 | 1080 | 4 |
| 16-QAM | 2025 | 540 | 8 |
| 64-QAM | 1350 | 360 | 12 |

The design and operation of the interleaver are described below with reference to FIGS. 7A and 7B.

Figure 7A:
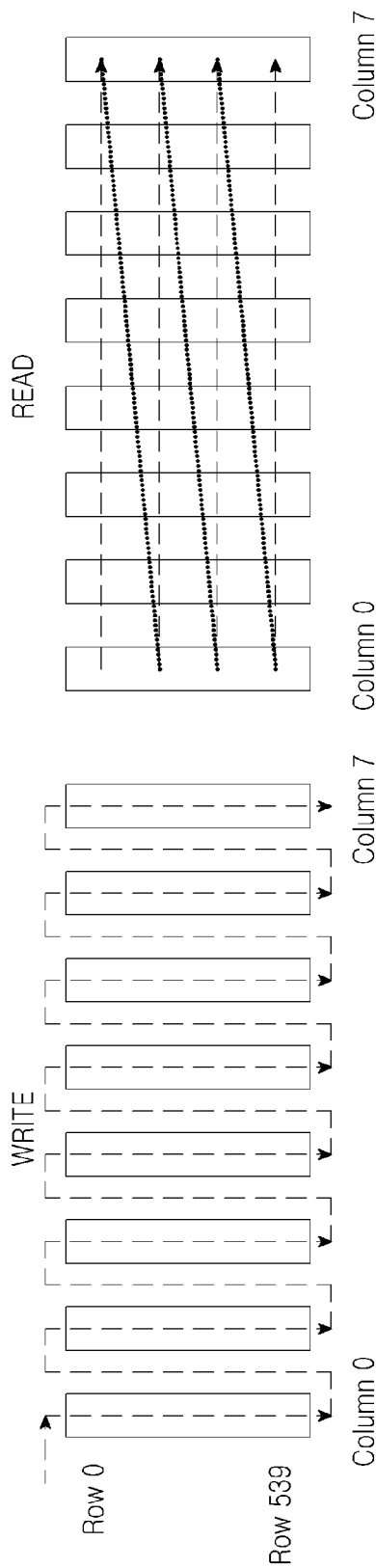
FIGS. 7A and 7B illustrate an operation of an interleaver according to an embodiment of the present invention.
Figure 7B:
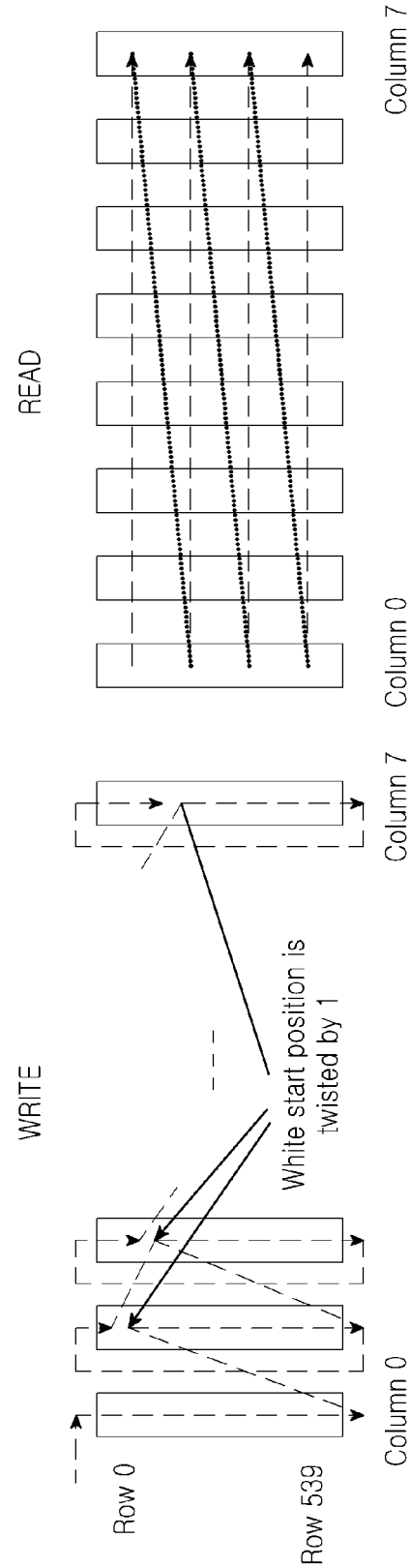

FIGS. 7A and 7B illustrate an operation of an interleaver according to an embodiment of the present invention. It is assumed that the interleaver in FIGS. 7A and 7B uses the 16-QAM modulation scheme and its LDPC codeword length is 4320. The above-described design and operation of an interleaver are described below in accordance with Steps 1 to 4.

Eight columns (8=the number of bits used in 16-QAM) is generated in Step 1, and the number of bits of rows is determined as 4320/8=540 in Step 2. LDPC codeword bits are sequentially written in each column in Step 3. If the writing in each column is completed, codeword bits are written in the next column as illustrated, and the number of bits written in each column is 540, which is the number of rows, calculated above. The codeword bits are sequentially read from each column bit by bit in Step 4. In the FIG. 7A, the codeword bits are sequentially read from a first bit in a column #0 through a first bit in a column #7, and then the codeword bits are sequentially read from a second bit in the column #0 through a second bit in a column #7. The above process is repeated as many times as the number, 540, of rows.

For the 64-QAM modulation scheme, 12 columns are generated and the number of bits of rows in Step 2 is determined as 4320/12=360. The 64-QAM modulation scheme may be applied in the same way as the 16-QAM modulation scheme, so a detailed description thereof is omitted.

The LDPC codeword is interleaved through the above process. In addition, arbitrary interleaving may be performed even in each column to additionally increase the interleaving performance. If there is an association between adjacent codeword bits, the codeword bits may become more robust against burst errors by undergoing interleaving. As the simplest example, the arbitrary interleaving may be a cyclic shift where it is possible to write a value to be shifted as a start position, rather than performing cyclic shift on each bit, as illustrated in FIG. 7B.

The bit-mapping scheme according to the present invention is described below, which maps the highest-degree bit in an one-row output in an interleaving output for an LDPC code to one of the lowest-reliability bits among the modulation signal-constituting bits, and maps some of the lowest-degree bits to one of the highest-reliability bits among the modulation signal-constituting bits, in which the ratio of the lowest-degree bits mapped to the highest-reliability bits depends on the ratio of the lowest-degree bits. However, because use of multiple DEMUXs increases complexity of the system, it is preferable to use the same DEMUX if possible, without simply changing the ratio of the lowest-degree bits mapped to the highest-reliability bits depending on the ratio of the lowest-degree bits. To this end, positions of columns of a parity check matrix may be changed. Otherwise, the bit-mapping scheme may use an interleaver only for the information part. A detailed description thereof is made with reference to FIGS. 9 and 10.

The DEMUXs in FIGS. 6A to 6D are described in detail below. The number of output streams of the DEMUXs is different depending on the modulation schemes, as shown in Table 2 below.

TABLE 2

| Modulation | Number of sub-streams, $N_{sub-stream}$ |
|---|---|
| QPSK | 4 |
| 16-QAM | 8 |
| 64-QAM | 12 |
| 256-QAM | 16 |

The DEMUX in FIG. 6D receives a bit-interleaved signal $v_{di}$ and outputs $b_{e,d_0}$, as follows.

$d_0 = d_i$ div $N_{substreams}$ $e(0 \le e < N_{substreams})$: It is a demultiplexed substream value, and may be defined as Tables 3 to 10.

$v_{di}$: An input to DEMUX $d_i$: An input bit number ($0 \le d_i < n$), where n represents a codeword length $b_{e,d_o}$: An output from DEMUX $d_0$: An output bit number of DEMUX $$\left(0 \geq d_0 < \frac{n}{N_{substreams}}\right)$$

$d_0$ represents a symbol index when a value obtained by dividing the number of bits of a codeword by the number of sub-streams is the number of symbols. e represents the number of sub-streams of demultiplexed bits.

The DEMUX in FIG. 6B for the 16-QAM modulation scheme is described in detail below, in which the codeword length is represented by n.

Output bits $v=\{v_0, v_1, v_2, v_3, \ldots, v_{n-1}\}$ of a bit interleaver are input to a DEMUX, which outputs $b_{0,d_0}, b_{1,d_0}, b_{2,d_0}, b_{3,d_0}, b_{4,d_0}, b_{5,d_0}, b_{6,d_0}, b_{7,d_0}$ $$\left(\text{for } 0 \leq d_0 < \frac{n}{8}\right).$$

In Tables 3 to 6, "input bit number, $d_i$ mod $N_{substreams}$" represents a value of "$d_i$ mod $N_{substreams}$" for an index $d_i$ of an input bit $v_{di}$, and "output bit number, e" represents a value e in an index e,$d_0$ of an output bit $b_{e,d_0}$.

Tables 3 to 6 show examples of the DEMUX in FIG. 6B in which output bits of an interleaver are allocated as modulation signal-constituting bits in accordance with the 16-QAM modulation scheme, on the assumption that the interleaver sequentially reads bits from the column #0 through the column #7 as in FIG. 7A.

In accordance with Table 3, $v_0$ is mapped to $b_{1,0}$, $v_1$ is mapped to $b_{7,0}$, $v_2$ is mapped to $b_{0,0}$, $v_3$ is mapped to $b_{5,0}$, $v_4$ is mapped to $b_{4,0}$, $v_5$ is mapped to $b_{2,0}$, $v_6$ is mapped to $b_{6,0}$, and $v_7$ is mapped to $b_{3,0}$. The expression "being mapped" as used herein may refer to establishing a relationship of $v_{d_i}$ mod $N_{substreams} = b_{e,d_0}$ $$\left(\text{for } 0 \leq d_i < n, 0 \leq d_0 \frac{n}{8}\right).$$

TABLE 3

| 16-QAM Input bit number, $d_i$ mod $N_{substreams}$ | | | | | | | |
|---|---|---|---|---|---|---|---|
| 0 | 1 | 2 | 3 | 4 | 5 | 6 | 7 |
| Output bit number, e | | | | | | | |
| 1 | 7 | 0 | 5 | 4 | 2 | 6 | 3 |

TABLE 4

| 16-QAM Input bit number, $d_i$ mod $N_{substreams}$ | | | | | | | |
|---|---|---|---|---|---|---|---|
| 0 | 1 | 2 | 3 | 4 | 5 | 6 | 7 |
| Output bit number, e | | | | | | | |
| 7 | 1 | 2 | 5 | 4 | 0 | 6 | 3 |

TABLE 5

| 16-QAM Input bit number, $d_i$ mod $N_{substreams}$ | | | | | | | |
|---|---|---|---|---|---|---|---|
| 0 | 1 | 2 | 3 | 4 | 5 | 6 | 7 |
| Output bit number, e | | | | | | | |
| 7 | 2 | 1 | 6 | 3 | 0 | 5 | 4 |

TABLE 6

| 16-QAM Input bit number, $d_i$ mod $N_{substreams}$ | | | | | | | |
|---|---|---|---|---|---|---|---|
| 0 | 1 | 2 | 3 | 4 | 5 | 6 | 7 |
| Output bit number, e | | | | | | | |
| 1 | 4 | 0 | 5 | 7 | 2 | 6 | 3 |

Among the output bits of the DEMUX described with reference to FIG. 6B, bits $b_{0,k}, b_{1,k}, b_{2,k}$ and $b_{3,k}$ constitute one same modulation signal. Among those bits, the $b_{0,k}$ and $b_{1,k}$ constitute $y_0$ and $y_1$ in FIG. 4B, respectively, and are mapped to the highest-reliability bits among the modulation signal-constituting bits, and the bits $b_{2,k}$ and $b_{3,k}$ constitute $y_2$ and $y_3$ in FIG. 4B, respectively, and are mapped to the lowest-reliability bits among the modulation signal-constituting bits. Among the output bits of the DEMUX described with reference to FIG. 6B, bits $b_{4,k}, b_{5,k}, b_{6,k}$ and $b_{7,k}$ constitute a same modulation signal. Among them, the bits $b_{4,k}$ and $b_{5,k}$ constitute $y_0$ and $y_1$ in FIG. 4B, respectively, and are mapped to the highest-reliability bits among the modulation signal-constituting bits, and the bits $b_{6,k}$ and $b_{7,k}$ constitute $y_2$ and $y_3$ in FIG. 4B, respectively, and are mapped to the lowest-reliability bits among the modulation signal-constituting bits.

In Tables 3 through 6 the output bits of the interleaver correspond to Rules 3 to 6.

The DEMUX in FIG. 6C for the 64-QAM modulation scheme is described in detail below.

Output bits $v=\{v_0, v_1, v_2, v_3, \ldots, v_{n-1}\}$ of a bit interleaver are input to the DEMUX, which outputs $b_{0,d_0}, b_{1,d_0}, b_{2,d_0}, b_{3,d_0}, b_{4,d_0}, b_{5,d_0}, b_{6,d_0}, b_{7,d_0}, b_{8,d_0}, b_{9,d_0}, b_{10,d_0}, b_{11,d_0}$ $$\left(\text{for } 0 \leq d_0 \frac{n}{12}\right).$$

In Tables 7 to 10, "input bit number, d, mod $N_{substreams}$" represents a value of "$d_i$ mod $N_{substreams}$" for an index $d_i$ of an input bit $v_{di}$, and "output bit number, e" represents a value e in an index e,$d_0$ of an output bit $b_{e,d_0}$.

Tables 7 to 10 show examples of the DEMUX in FIG. 6C in which output bits of an interleaver are allocated as modulation signal-constituting bits in accordance with the 64-QAM modulation scheme.

In Table 7, $v_0$ is mapped to $b_{11,0}$, $v_1$ is mapped to $b_{1,0}$, $v_2$ is mapped to $b_{9,0}$, $v_3$ is mapped to $b_{7,0}$, $v_4$ is mapped to $b_{0,0}$, $v_5$ is mapped to $b_{6,0}$, $v_6$ is mapped to $b_{3,0}$, $v_7$ is mapped to $b_{8,0}$, $v_8$ is mapped to $b_{2,0}$, $v_9$ is mapped to $b_{5,0}$, $v_{10}$ is mapped to $b_{10,0}$, and $v_{11}$ is mapped to $b_{4,0}$. The expression "being mapped" as used herein may refer to establishing a relationship of $v_{d_i}$ mod $N_{substreams} = b_{e,d_0}$.

$$\left(\text{for } 0 \leq d_i < n, 0 \leq d_0 \frac{n}{12}\right).$$

TABLE 7

| 64-QAM Input bit number, $d_i$ mod $N_{substreams}$ | | | | | | | | | | | |
|---|---|---|---|---|---|---|---|---|---|---|---|
| 0 | 1 | 2 | 3 | 4 | 5 | 6 | 7 | 8 | 9 | 10 | 11 |
| Output bit number, e | | | | | | | | | | | |
| 11 | 1 | 9 | 7 | 0 | 6 | 3 | 8 | 2 | 5 | 10 | 4 |

TABLE 8

64-QAM
Input bit number, $d_i$ mod $N_{substreams}$

| | 0 | 1 | 2 | 3 | 4 | 5 | 6 | 7 | 8 | 9 | 10 | 11 |
|---|---|---|---|---|---|---|---|---|---|---|---|---|
| Output bit number, e | 9 | 11 | 1 | 6 | 0 | 7 | 2 | 8 | 3 | 5 | 10 | 4 |

TABLE 9

64-QAM
Input bit number, $d_i$ mod $N_{substreams}$

| | 0 | 1 | 2 | 3 | 4 | 5 | 6 | 7 | 8 | 9 | 10 | 11 |
|---|---|---|---|---|---|---|---|---|---|---|---|---|
| Output bit number, e | 11 | 4 | 10 | 5 | 2 | 9 | 3 | 8 | 7 | 0 | 6 | 1 |

TABLE 10

64-QAM
Input bit number, $d_i$ mod $N_{substreams}$

| | 0 | 1 | 2 | 3 | 4 | 5 | 6 | 7 | 8 | 9 | 10 | 11 |
|---|---|---|---|---|---|---|---|---|---|---|---|---|
| Output bit number, e | 11 | 4 | 10 | 0 | 5 | 9 | 1 | 6 | 7 | 2 | 8 | 3 |

Figure 8A:
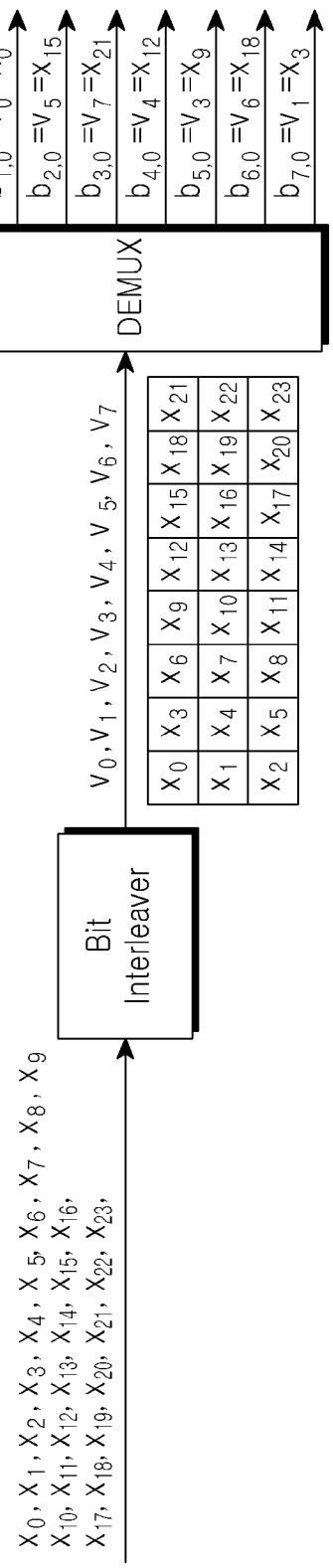
FIGS. 8A and 8B illustrate interleaver and a bit-mapping method according to an embodiment of the present invention.

The operation of inputting and outputting signals based on the interleaving and bit-mapping schemes according to the present invention so far is described below with reference to FIG. 8A.

Assuming that a modulation scheme is 16-QAM and a codeword length is 24, a column size of an interleaver is 8 and a row size thereof is 3. Assume that the bit-mapping method applies 16-QAM (Method 1) in Table 3.

Assume that a codeword output from an LDPC encoder is $X=[x_0, x_1, x_2, x_3, x_4, x_5, x_6, x_7, x_8, x_9, x_{10}, x_{11}, x_{12}, x_{13}, x_{14}, x_{15}, x_{16}, x_{17}, x_{18}, x_{19}, x_{20}, x_{21}, x_{22}, x_{23}]$. If the codeword bits are sequentially written in the interleaver 513 column by column, $\{x_0, x_1, x_2\}$ are written in a column #1 of the interleaver 513, $\{x_3, x_4, x_5\}$ are written in a column #2, $\{x_6, x_7, x_8\}$ are written in a column #3, $\{x_9, x_{10}, x_{11}\}$ are written in a column #4, $\{x_{12}, x_{13}, x_{14}\}$ are written in a column #5, $\{x_{15}, x_{16}, x_{17}\}$ are written in a column #6, $\{x_{18}, x_{19}, x_{20}\}$ are written in a column #7, and $\{x_{21}, x_{22}, x_{23}\}$ are written in a column #8. Bits read from the columns row by row, i.e., an interleaved output signal, are $v=[v_0, v_1, v_2, v_3, v_4, v_5, v_6, v_7]=[x_0, x_3, x_6, x_9, x_{12}, x_{15}, x_{18}, x_{21}]$.

If output bits v are input to the DEMUX 515, $y=\{b_{0,0}, b_{1,0}, b_{2,0}, b_{3,0}, b_{4,0}, b_{5,0}, b_{6,0}, b_{7,0}\}=\{v_2, v_0, v_5, v_7, v_4, v_3, v_6, v_1\}=\{x_6, x_0, x_{15}, x_{21}, x_{12}, x_9, x_{18}, x_3\}$, since they are mapped according to the above mapping rules. That is, as for bits mapped to the bits $b_{0,0}, b_{1,0}, b_{2,0}$ and $b_{3,0}$ constituting a first modulation signal, a codeword mapped to the highest-reliability sign-determining bits $b_{0,0}$ and $b_{1,0}$ includes $x_6$ and $x_0$. A codeword mapped to the low-reliability magnitude-determining bits $b_{2,0}$ and $b_{3,0}$ includes $x_{15}$ and $x_{21}$. As for bits mapped to the bits $b_{4,0}, b_{5,0}, b_{6,0}$ and $b_{7,0}$ constituting a second modulation signal, a codeword mapped to the highest-reliability sign-determining bits $b_{4,0}$ and $b_{5,0}$ includes $x_{12}$ and $x_9$. A codeword mapped to the low-reliability magnitude-determining bits $b_{6,0}$ and $b_{37,0}$ includes $x_{18}$ and $x_3$.

Figure 8B:
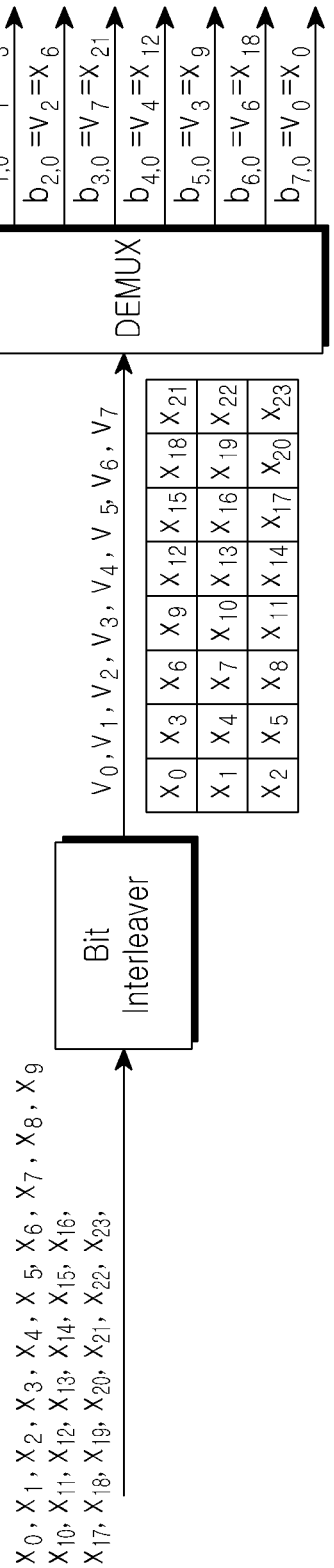

The operation of inputting and outputting signals based on the interleaving and bit-mapping schemes according to the present invention so far is described below with reference to FIG. 8B.

Assuming that a modulation scheme is 16-QAM and a codeword length is 24, a column size of an interleaver is 8 and a row size thereof is 3. Assume that the bit-mapping method applies 16-QAM (Method 2) in Table 4.

Assume that a codeword output from an LDPC encoder is $X=[x_0, x_1, x_2, x_3, x_4, x_5, x_6, x_7, x_8, x_9, x_{10}, x_{11}, x_{12}, x_{13}, x_{14}, x_{15}, x_{16}, x_{17}, x_{18}, x_{19}, x_{20}, x_{21}, x_{22}, x_{23}]$. If the codeword bits are sequentially written in the interleaver 513 column by column, $\{x_0, x_1, x_2\}$ are written in a column #1 of the interleaver 513, $\{x_3, x_4, x_5\}$ are written in a column #2, $\{x_6, x_7, x_8\}$ are written in a column #3, $\{x_9, x_{10}, x_{11}\}$ are written in a column #4, $\{x_{12}, x_{13}, x_{14}\}$ are written in a column #5, $\{x_{15}, x_{16}, x_{17}\}$ are written in a column #6, $\{x_{18}, x_{19}, x_{20}\}$ are written in a column #7, and $\{x_{21}, x_{22}, x_{23}\}$ are written in a column #8. Bits read from the columns row by row, i.e., an interleaved output signal, are $v=[v_0, v_1, v_2, v_3, v_4, v_5, v_6, v_7]=[x_0, x_3, x_6, x_9, x_{12}, x_{15}, x_{18}, x_{21}]$.

If output bits v are input to the DEMUX 515, $y=\{b_{0,0}, b_{1,0}, b_{2,0}, b_{3,0}, b_{4,0}, b_{5,0}, b_{6,0}, b_{7,0}\}=\{v_5, v_1, v_2, v_7, v_4, v_3, v_6, v_0\}=\{x_{15}, x_3, x_6, x_{21}, x_{12}, x_9, x_{18}, x_0\}$, since they are mapped according to the above mapping rules. That is, as for bits mapped to the bits $b_{0,0}, b_{1,0}, b_{2,0}$ and $b_{3,0}$ constituting a first modulation signal, a codeword mapped to the highest-reliability sign-determining bits $b_{0,0}$ and $b_{1,0}$ includes $x_{15}$ and $x_3$. A codeword mapped to the low-reliability magnitude-determining bits $b_{2,0}$ and $b_{3,0}$ includes $x_6$ and $x_{21}$. As for bits mapped to the bits $b_{4,0}, b_{5,0}, b_{6,0}$ and $b_{7,0}$ constituting a second modulation signal, a codeword mapped to the highest-reliability sign-determining bits $b_{4,0}$ and $b_{5,0}$ includes $x_{12}$ and $x_9$. A codeword mapped to the low-reliability magnitude-determining bits $b_{6,0}$ and $b_{37,0}$ includes $x_{18}$ and $x_0$.

Figures 1, 2:
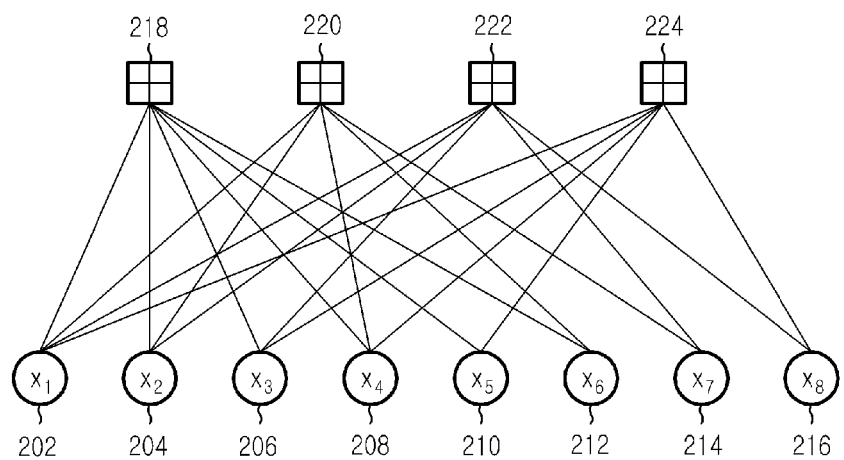
FIG. 1 is a diagram illustrating a parity check matrix $H_1$ of an LDPC code.
FIG. 2 is a diagram of a graph representation of a parity check matrix $H_1$ of an LDPC code.
Figure 3:
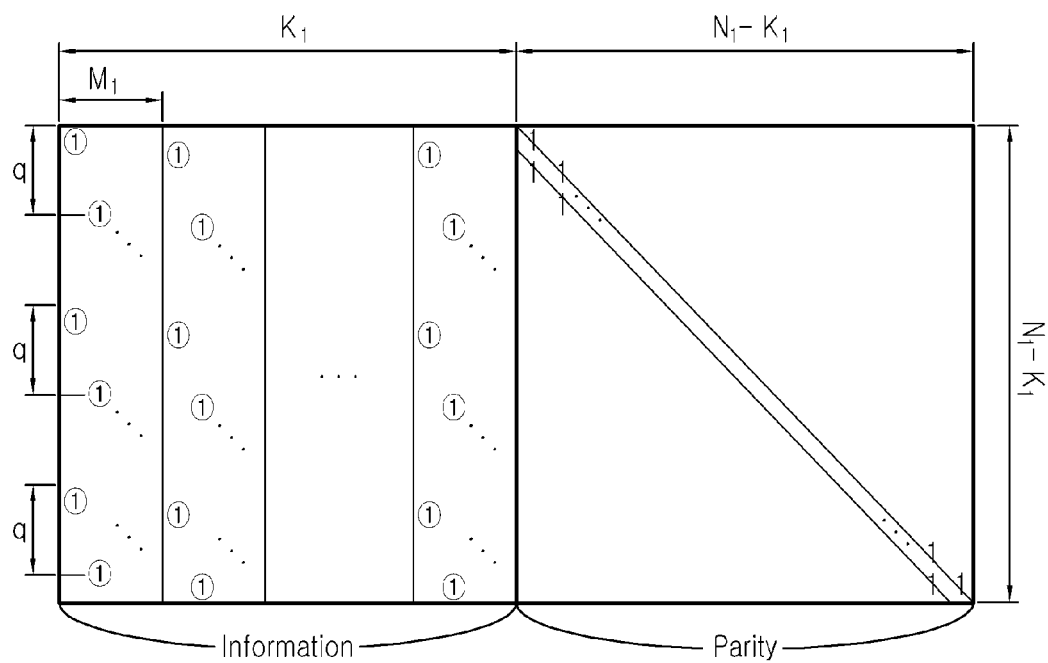
FIG. 3 is a diagram illustrating a parity check matrix of an LDPC code, having a specific structure.

As an example of an LDPC code, for an LDPC code having the structure of the parity check matrix in FIG. 3, R=1/3, N=4230, K=1440, M=72 and q=40, and position information of rows with a weight of 1 in 0-th columns in 20 column groups may be represented as the following sequences. That is, the i-th weight-1 position sequences represent position information of rows with a value of 1 in i-th column groups, respectively.

Here, excellent performance may be achieved when the DEMUX in Table 4 is used for the 16-QAM modulation scheme, and the DEMUX in Table 7 is used for the 64-QAM modulation.

22 451 529 665 1424 1566 1843 1897 1940 2069 2334 2760 2833

287 303 321 644 874 1110 1132 1175 1266 1377 1610 1819 2517

58 183 247 821 965 1315 1558 1802 1969 2013 2095 2271 2627

181 285 1171 1208 1239 1468 1956 1992 2083 2253 2456 2664 2859

209 1067 1240 2698

970 1201 2099 2388

211 1820 2602 2630

471 1101 1972 2244

254 793 2546 2680

147 761 1495 2794

75 1108 2256 2842

178 796 1309 1763

1820 2157 2470 2686

998 1502 1728 2431

1385 1432 1919 2730

244 972 1673 1902

583 1333 1645 2675

316 664 1086 2854

776 997 2287 2825

537 1719 1746 2728

As an example of an LDPC code, for an LDPC code having the structure of the parity check matrix in FIG. 3, R=5/12, N=4320, K=1800, M=72 and q=35, and position information of rows with a weight of 1 in 0-th columns in 25 column groups may be represented as the following sequences. That is, the i-th weight-1 position sequences represent position information of rows with a value of 1 in i-th column groups, respectively.

Here, excellent performance may be achieved when the DEMUX in Table 4 is used for the 16-QAM modulation scheme, and the DEMUX in Table 7 is used for the 64-QAM modulation.

103 134 272 282 763 1086 1107 1599 1797 1904 2047 2281 2398
8 232 419 579 676 1333 1486 1710 1777 2079 2193 2377 2415
147 268 335 726 1260 1536 1654 1879 1975 2086 2187 2314 2378
5 450 726 833 860 1200 1425 1507 1512 1588 1921 2029 2504
841 1428 1909 2157
1173 1467 1744 2137
253 618 2173 2309
1163 1518 1836 2425
1276 1563 1646 2320
140 799 847 1306
49 1249 1364 1663
38 509 517 1816
677 761 1544 1842
798 1021 1728 1911
160 772 1325 2465
146 1214 1241 1700
608 672 2082 2506
648 1514 1777 2489
82 415 1755 2196
1096 2140 2149 2475
278 1030 1051 2285
66 1439 2345 2391
251 1683 2252 2494
130 260 428 1328
767 1335 1374 2152

As an example of an LDPC code, for an LDPC code having the structure of the parity check matrix in FIG. 3, R=1/5, N=4320, K=864, M=72 and q=48, and position information of rows with a weight of 1 in 0-th columns in 12 column groups may be represented as the following sequences. That is, the i-th weight-1 position sequences represent position information of rows with a value of 1 in i-th column groups, respectively.

Here, excellent performance may be achieved when the DEMUX in Table 3 is used for the 16-QAM modulation scheme, and the DEMUXs in Tables 8 to 10 are used for the 64-QAM modulation.

384 944 1269 2266
407 1907 2268 2594
1047 1176 1742 1779
304 890 1817 2645
102 316 353 2250
488 811 1662 2323
31 2397 2468 3321
102 514 828 1010 1024 1663 1737 1870 2154 2390 2523 2759 3380
216 383 679 938 970 975 1668 2212 2300 2381 2413 2754 2997
536 889 993 1395 1603 1691 2078 2344 2545 2741 3157 3334 3377
694 1115 1167 2548
1266 1993 3229 3415

As an example of an LDPC code, for an LDPC code having the structure of the parity check matrix in FIG. 3, R=1/4, N=4320, K=1080, M=72 and q=45, and position information of rows with a weight of 1 in 0-th columns in 15 column groups may be represented as the following sequences. That is, the i-th weight-1 position sequences represent position information of rows with a value of 1 in i-th column groups, respectively.

Here, excellent performance may be achieved when the DEMUX in Table 3 is used for the 16-QAM modulation scheme, and the DEMUXs in Tables 9 and 10 are used for the 64-QAM modulation.

1343 1563 2745 3039
1020 1147 1792 2609
2273 2320 2774 2976
665 2539 2669 3010
581 1178 1922 2998
633 2559 2869 2907
876 1213 2191 2261
916 1217 1632 2798
500 992 1230 2630
1842 2038 2169 2312
595 679 1206 1486
1087 2681 2894 3 123
73 185 355 1381 1672 1998 2406 2577 2600 2834 3084 3115 3150
22 65 390 1022 1046 1465 1498 1682 1879 2108 2164 2203 3106
127 213 714 816 1031 1456 1815 2097 2183 2404 2934 2999 3153

The LDPC codes based on the parity check matrixes of Embodiments 5 and 6 may use the same DEMUX by adjusting positions of columns having the maximum degree, even though they have different degree distributions. A detailed description thereof will be given with reference to FIGS. 9 and 10.

The interleaving and bit-mapping schemes according to the present invention are described below in detail based on the DVB-T2 and DVB-NGH systems. However, the interleaving and bit-mapping schemes of the present invention will not be limited to these systems.

Figure 9:
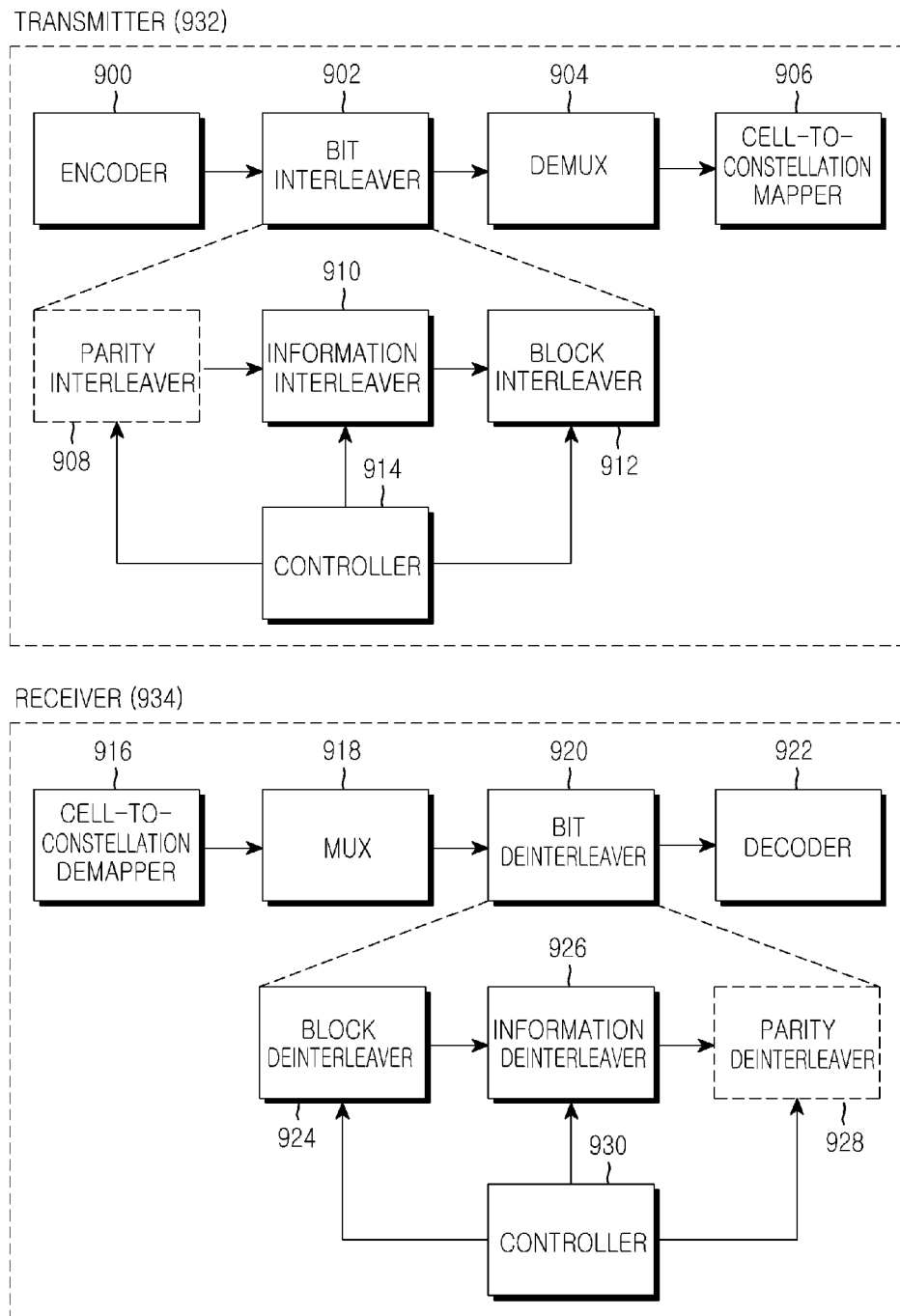
FIG. 9 is a diagram illustrating structures of a transmitter and a receiver according to an embodiment of the present invention.

FIG. 9 is a diagram illustrating structures of a transmitter and a receiver according to an embodiment of the present invention.

Referring to FIG. 9, a transmitter 932 includes an encoder 900, a bit interleaver 902 having a parity interleaver 908, an information interleaver 910 and a block interleaver 912, a DEMUX 904, a cell-to-constellation mapper 906, and a controller 914.

The encoder 900 encodes an LDPC code and outputs the encoded bits to the bit interleaver 902. The bit interleaver 902 includes the parity interleaver 908, the information interleaver 910, and the block interleaver 912. The parity interleaver 908 uses only parity bits in the LDPC codeword in the DVB-T2 system. A detailed description thereof will be omitted for simplicity. The information interleaver 910 interleaves only information bits in the LDPC codeword which makes it possible to use the same DEMUX by interleaving only information bits, in order not to use different DEMUXs at different coding rates to obtain the optimal performance as described above. It is understood by those of ordinary skill in the art that the parity interleaver 908 and the information interleaver 910 may obtain the same effect even though their order is different. Output data of the information interleaver 910 is input to the block interleaver 912. The block interleaver 912 operates as described with reference to FIGS. 6A to 6D. Output data of the block interleaver 912 is input to the DEMUX 904. The DEMUX 904 is configured based on Tables 3 to 10, and performs the DEMUX operations described in detail with reference to FIGS. 6A to 6D and FIGS. 8A and 8B. Output bits of the DEMUX 904 are input to the cell-to-constellation mapper 906. It is understood by those of ordinary skill in the art that the DEMUX 904 plays the same role as the signal-to-constellation bit mapper 515 in FIG. 5. Also, it is apparent to those of ordinary skill in the art that the parity interleaver 908 is optional in the transmitter 932.

Deinterleaving and bit-demapping schemes used in a receiver 934 are described below. Since it is apparent to those of ordinary skill in the art that the receiver 934 may be configured to correspond to the transmitter 932, a description thereof will be made in brief. That is, a cell-to-constellation demapper 916 in the receiver 934 outputs modulation signal-constituting bits by performing high-order modulation on received signals, and a MUX 918 outputs demapped signals by bit-demapping the modulation signal-constituting bits. The demapping method used here corresponds to the bit-mapping scheme of the DEMUX 904. A bit deinterleaver 920 bit-deinterleaves the demapped signals. A size of the bit deinterleaver 920 is the same as the size of the bit interleaver 902 in the transmitter 932. The bit deinterleaver 920 includes a block deinterleaver 924, an information deinterleaver 926, and a parity deinterleaver 928. The block deinterleaver 924 writes the parity-deinterleaved signal row by row, and reads it column by column, thereby outputting deinterleaved signals. The deinterleaved signals are input to the information deinterleaver 926. The information deinterleaver 926 corresponds to the interleaving scheme of the information interleaver 910. The deinterleaved information signals are input to the parity deinterleaver 928. The parity deinterleaver 928 corresponds to the interleaving scheme of the parity interleaver 908. The bit-deinterleaved signals are input to a decoder 922. The decoder 922 decodes input signals using a decoding scheme corresponding to the coding scheme of the encoder 900.

It is possible to change positions of columns of a parity check matrix, instead of using the information interleaver 910 in FIG. 9. Therefore, positions of columns of the parity check matrix may be changed to correspond to the information interleaver 910 in FIG. 9. It will be apparent to those of ordinary skill in the art that the changed parity check matrix may be stored in a memory.

Figure 10:
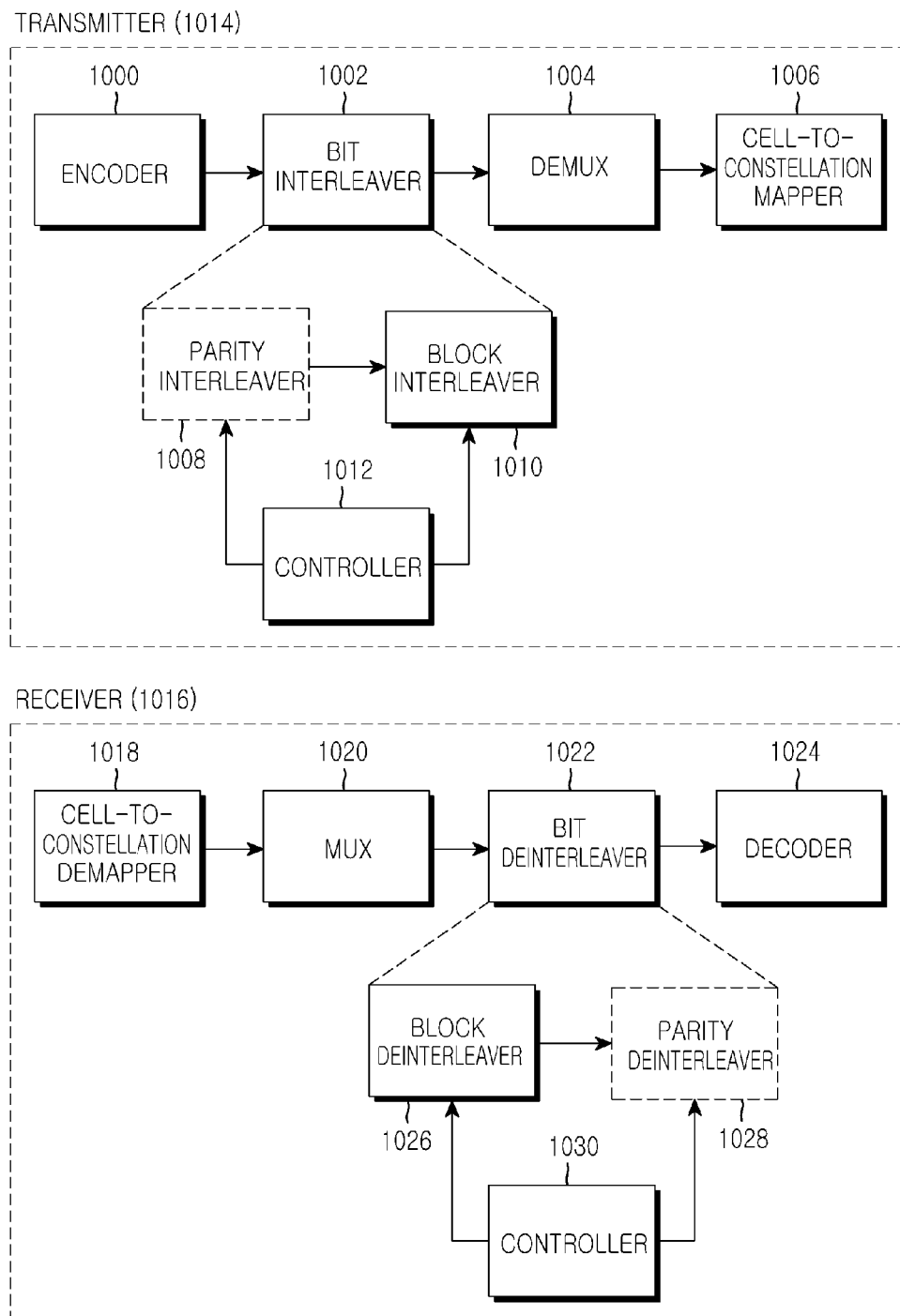
FIG. 10 is a diagram illustrating structures of a transmitter and a receiver according to another embodiment of the present invention.

FIG. 10 is a diagram illustrating structures of a transmitter and a receiver according to another embodiment of the present invention.

Referring to FIG. 10, an encoder 1000 encodes an LDPC code and outputs the encoded bits to a bit interleaver 1002. The bit interleaver 1002 includes two blocks: a parity interleaver 1008 and a block interleaver 1010. A controller 1012 informs the parity interleaver 1008 and the block interleaver 1010 of the number of parity bits to meet the coding rate, and of the start positions when the bits are read from the block interleaver 1010. The parity interleaver 1008, which interleaves only parity bits among the codeword bits, is used in the DVB-T2 system. Output bits of the bit interleaver 1002 are input to the DEMUX 1004. The DEMUX 1004 is configured based on Tables 3 to 10, and performs the DEMUX operation described in detail with reference to FIGS. 6A to 6D and FIGS. 8A and 8B. Output bits of the DEMUX 1004 are input to a cell-to-constellation mapper 1006. It will be understood by those of ordinary skill in the art that the DEMUX 1004 plays the same role as the bit mapper 515 in FIG. 5. Also, it will be apparent to those of ordinary skill in the art that the parity interleaver 1008 is optional in the transmitter 1014.

The interleaving and bit-mapping schemes in the transmitter 1014 have been described so far. Deinterleaving and bit-demapping schemes used in a receiver 1016 are described below. Since it is apparent to those of ordinary skill in the art that the receiver 1016 may be configured to correspond to the transmitter 1014, a description thereof will be made in brief. That is, a cell-to-constellation demapper 1018 in the receiver 1016 outputs modulation signal-constituting bits by performing high-order modulation on received signals, and a MUX 1020 outputs demapped signals by bit-demapping the modulation signal-constituting bits. The demapping method used here corresponds to the bit-mapping scheme of the transmitter 1014. A bit deinterleaver 1022 bit-deinterleaves the demapped signals. A size of the bit deinterleaver 1022 is the same as the size of the bit interleaver 1002 in the transmitter 1014. The bit deinterleaver 1022 includes a block deinterleaver 1026 and a parity deinterleaver 1028. The block deinterleaver 1026 writes the parity-deinterleaved signal row by row, and reads it column by column, thereby outputting deinterleaved signals.

The deinterleaved signals are input to the parity deinterleaver 1028. The parity deinterleaver 1028 corresponds to the interleaving scheme of the parity interleaver 1008. The bit-deinterleaved signals are input to a decoder 1024. The decoder 1024 decodes input signals using a decoding scheme corresponding to the coding scheme of the encoder 1000.

The interleaving and bit-mapping schemes in the transmitter 500 have been described so far. The deinterleaving and bit-demapping schemes used in the receiver 550 are described below. Since it is apparent to those of ordinary skill in the art that the receiver 550 may be configured to correspond to the transmitter 500, a brief description thereof will be made. That is, the demodulator 557 in the receiver 550 outputs modulation signal-constituting bits by performing high-order demodulation on received signals, and the bit demapper 555 outputs demapped signals by bit-demapping the modulation signal-constituting bits. The demapping method used here corresponds to the bit-mapping scheme of the transmitter 500. The bit demapper 555 includes a MUX (not shown) because it corresponds to the bit mapper 515 in the transmitter 500.

The bit-demapped signals are input to the deinterleaver 553. A size of the deinterleaver 553 is the same as the size of the interleaver 513 in the transmitter 500. The deinterleaver 553 writes the bit-demapped signals row by row, and reads them columns by column in a forward direction (starting from a row #1), thereby outputting deinterleaved LDPC codeword bits. The deinterleaved LDPC codeword bits are input to the decoder 551, in which they undergo decoding.

As is apparent from the forgoing description, the present invention may maximize performance of an LDPC codeword in a communication system using a parity check matrix, improve decoding performance of an LDPC code, improve reliabilities of low-error correcting capability bits among the bits constituting an LDPC code, improve the reliability of data transmission/reception by increasing performance of links in a wireless channel environment where performance of the links is likely to fall due to the noises, fading and ISI and reduce signal error rates in the entire communication or broadcasting system, for reliable transmission/reception of an LDPC code, thereby enabling fast communication.

While the invention has been described with reference to various embodiments thereof, it is understood by those of ordinary skill in the art that various changes in form and detail may be made therein without departing from the spirit and scope of the present invention as defined by the appended claims.

What is claimed is:

1. A method for transmitting data in a communication or broadcasting system, comprising:
generating a codeword by encoding input information data bits;
interleaving the codeword;
demultiplexing the interleaved codeword using a bit-mapping table that is determined based on a modulation scheme and a coding rate;
outputting a modulation signal by modulating the demultiplexed bits; and
transmitting the modulation signal,
wherein when the modulation scheme is 16-Quadrature Amplitude Modulation (16-QAM) and the coding rate includes one of 1/5 and 1/4, the bit-mapping table is defined as:

| | 16-QAM Input bit number | | | | | | | |
|---|---|---|---|---|---|---|---|---|
| | 0 | 1 | 2 | 3 | 4 | 5 | 6 | 7 |
| Output bit number | 1 | 7 | 0 | 5 | 4 | 2 | 6 | 3 | where the "input bit number" represents an input bit number $d_i$ in the interleaved codeword $v_{d_i}$, and the "output bit number" represents a demultiplexed substream value e in the demultiplexed bits $b_{e,d_0}$.

2. A method for transmitting data in a communication or broadcasting system, comprising:
generating a codeword by encoding input information data bits;
interleaving the codeword;
demultiplexing the interleaved codeword using a bit-mapping table that is determined based on a modulation scheme and a coding rate;
outputting a modulation signal by modulating the demultiplexed bits; and
transmitting the modulation signal,
wherein when the modulation scheme is 16-Quadrature Amplitude Modulation (16-QAM) and the coding rate includes one of 1/3 and 5/12, the bit-mapping table is defined as:

| | 16-QAM Input bit number | | | | | | | |
|---|---|---|---|---|---|---|---|---|
| | 0 | 1 | 2 | 3 | 4 | 5 | 6 | 7 |
| Output bit number | 7 | 1 | 2 | 5 | 4 | 0 | 6 | 3 | where the "input bit number" represents an input bit number $d_i$ in the interleaved codeword $v_{d_i}$, and the "output bit number" represents a demultiplexed substream value e in the demultiplexed bits $b_{e,d_0}$.

3. A method for transmitting data in a communication or broadcasting system, comprising:
generating a codeword by encoding input information data bits;
interleaving the codeword;
demultiplexing the interleaved codeword using a bit-mapping table that is determined based on a modulation scheme and a coding rate;
outputting a modulation signal by modulating the demultiplexed bits; and
transmitting the modulation signal,
wherein outputting modulation signal-constituting bits comprises bit-mapping the interleaved codeword using a different bit-mapping scheme depending on a ratio of lowest-degree bits to all bits constituting the interleaved codeword.

4. A method for transmitting data in a communication or broadcasting system, comprising:
generating a codeword by encoding input information data bits;
interleaving the codeword;
demultiplexing the interleaved codeword using a bit-mapping table that is determined based on a modulation scheme and a coding rate;
outputting a modulation signal by modulating the demultiplexed bits; and
transmitting the modulation signal,
wherein demultiplexing the interleaved codeword comprises bit-mapping the interleaved codeword using a different bit-mapping scheme depending on at least one of a degree distribution of a parity check matrix and positions of columns of an information part of the parity check matrix.

5. An apparatus for transmitting data in a communication or broadcasting system, comprising:
an encoder for generating a codeword by encoding input information data bits;
an interleaver for interleaving the codeword;
a demultiplexer for demultiplexing the interleaved codeword using a bit-mapping table that is determined based on a modulation scheme and a coding rate;
a modulator for outputting a modulation signal by modulating the demultiplexed bits; and
a transmitter for transmitting the modulation signal,
wherein when the modulation scheme is 16-Quadrature Amplitude Modulation (16-QAM) and the coding rate includes one of 1/5 and 1/4, the bit-mapping table is defined as:

| | 16-QAM Input bit number | | | | | | | |
|---|---|---|---|---|---|---|---|---|
| | 0 | 1 | 2 | 3 | 4 | 5 | 6 | 7 |
| Output bit number | 1 | 7 | 0 | 5 | 4 | 2 | 6 | 3 | where the "input bit number" represents an input bit number $d_i$ in the interleaved codeword $v_{d_i}$, and the "output bit number" represents a demultiplexed substream value e in the demultiplexed bits $b_{e,d_0}$.

6. An apparatus for transmitting data in a communication or broadcasting system, comprising:
an encoder for generating a codeword by encoding input information data bits;
an interleaver for interleaving the codeword;
a demultiplexer for demultiplexing the interleaved codeword using a bit-mapping table that is determined based on a modulation scheme and a coding rate;
a modulator for outputting a modulation signal by modulating the demultiplexed bits; and
a transmitter for transmitting the modulation signal,
wherein when the modulation scheme is 16-Quadrature Amplitude Modulation (16-QAM) and the coding rate includes one of 1/3 and 5/12, the bit-mapping table is defined as:

| | 16-QAM Input bit number | | | | | | | |
|---|---|---|---|---|---|---|---|---|
| | 0 | 1 | 2 | 3 | 4 | 5 | 6 | 7 |
| Output bit number | 7 | 1 | 2 | 5 | 4 | 0 | 6 | 3 | where the "input bit number" represents an input bit number $d_i$ in the interleaved codeword $v_d$, and the "output bit number" represents a demultiplexed substream value e in the demultiplexed bits $b_{e,d_0}$.

7. An apparatus for transmitting data in a communication or broadcasting system, comprising:
   an encoder for generating a codeword by encoding input information data bits;
   an interleaver for interleaving the codeword;
   a demultiplexer for demultiplexing the interleaved codeword using a bit-mapping table that is determined based on a modulation scheme and a coding rate;
   a modulator for outputting a modulation signal by modulating the demultiplexed bits; and
   a transmitter for transmitting the modulation signal,
   wherein the demultiplexer demultiplexes the interleaved codeword using a different bit-mapping scheme depending on a ratio of lowest-degree bits to all bits constituting the interleaved codeword.

8. An apparatus for transmitting data in a communication or broadcasting system, comprising:
   an encoder for generating a codeword by encoding input information data bits;
   an interleaver for interleaving the codeword;
   a demultiplexer for demultiplexing the interleaved codeword using a bit-mapping table that is determined based on a modulation scheme and a coding rate;
   a modulator for outputting a modulation signal by modulating the demultiplexed bits; and
   a transmitter for transmitting the modulation signal,
   wherein the demultiplexer demultiplexes the interleaved codeword using a different bit-mapping scheme depending on at least one of a degree distribution of a parity check matrix and positions of columns of an information part of the parity check matrix.

9. A method for receiving data in a communication or broadcasting system, comprising:
   receiving a signal transmitted by a transmitter;
   demodulating the received signal;
   multiplexing the demodulated signal using a bit-mapping table that is determined based on a modulation scheme and a coding rate of the transmitter;
   deinterleaving the multiplexed bits; and
   decoding the deinterleaved bits,
   wherein when the modulation scheme is 16-Quadrature Amplitude Modulation (16-QAM) and the coding rate includes one of 1/5 and 1/4, the bit-mapping table is defined as:

| | 16-QAM Output bit number | | | | | | | |
|---|---|---|---|---|---|---|---|---|
| | 0 | 1 | 2 | 3 | 4 | 5 | 6 | 7 |
| Input bit number | 1 | 7 | 0 | 5 | 4 | 2 | 6 | 3 | where the "output bit number" represents an output bit number $d_i$ in an interleaved codeword $v_d$, by the transmitter, and the "input bit number" represents a received substream value e in the demodulated bits $b_{e,d_0}$.

10. A method for receiving data in a communication or broadcasting system, comprising:
    receiving a signal transmitted by a transmitter;
    demodulating the received signal;
    multiplexing the demodulated signal using a bit-mapping table that is determined based on a modulation scheme and a coding rate of the transmitter;
    deinterleaving the multiplexed bits; and
    decoding the deinterleaved bits,
    wherein when the modulation scheme is 16-Quadrature Amplitude Modulation (16-QAM) and the coding rate includes one of 1/3 and 5/12, the bit-mapping table is defined as:

| | 16-QAM Output bit number | | | | | | | |
|---|---|---|---|---|---|---|---|---|
| | 0 | 1 | 2 | 3 | 4 | 5 | 6 | 7 |
| Input bit number | 7 | 1 | 2 | 5 | 4 | 0 | 6 | 3 | where the "output bit number" represents an output bit number $d_i$ in an interleaved codeword $v_d$, by the transmitter, and the "input bit number" represents a received substream value e in the demodulated bits $b_{e,d_0}$.

11. A method for receiving data in a communication or broadcasting system, comprising:
    receiving a signal transmitted by a transmitter;
    demodulating the received signal;
    multiplexing the demodulated signal using a bit-mapping table that is determined based on a modulation scheme and a coding rate of the transmitter;
    deinterleaving the multiplexed bits; and
    decoding the deinterleaved bits,
    wherein multiplexing comprises multiplexing the demodulated signal using a different multiplexing scheme depending on a ratio of lowest-degree bits to all bits constituting an interleaved codeword by the transmitter.

12. A method for receiving data in a communication or broadcasting system, comprising:
    receiving a signal transmitted by a transmitter;
    demodulating the received signal;
    multiplexing the demodulated signal using a bit-mapping table that is determined based on a modulation scheme and a coding rate of the transmitter;
    deinterleaving the multiplexed bits; and
    decoding the deinterleaved bits,
    wherein multiplexing comprises multiplexing the demodulated signal using a different multiplexing scheme depending on at least one of a degree distribution of a parity check matrix and positions of columns of an information part of the parity check matrix.

13. An apparatus for receiving data in a communication or broadcasting system, comprising:
    a receiver for receiving a signal transmitted by a transmitter;
    a demodulator for demodulating the received signal;
    a multiplexer for multiplexing the demodulated signal using a bit-mapping table that is determined based on a modulation scheme and a coding rate of the transmitter;
    a deinterleaver for deinterleaving the multiplexed bits; and
    a decoder for decoding the deinterleaved bits,
    wherein when the modulation scheme is 16-Quadrature Amplitude Modulation (16-QAM) and the coding rate includes one of 1/5 and 1/4, the bit-mapping table is defined as:

| 16-QAM Output bit number | | | | | | | |
|---|---|---|---|---|---|---|---|
| 0 | 1 | 2 | 3 | 4 | 5 | 6 | 7 |

| Input bit number | 1 | 7 | 0 | 5 | 4 | 2 | 6 | 3 | where the "output bit number" represents an output bit number $d_i$ in an interleaved codeword $v_d$ by the transmitter, and the "input bit number" represents a received substream value e in the demodulated bits $b_{e,d_0}$.

14. An apparatus for receiving data in a communication or broadcasting system, comprising:
- a receiver for receiving a signal transmitted by a transmitter;
- a demodulator for demodulating the received signal;
- a multiplexer for multiplexing the demodulated signal using a bit-mapping table that is determined based on a modulation scheme and a coding rate of the transmitter;
- a deinterleaver for deinterleaving the multiplexed bits; and
- a decoder for decoding the deinterleaved bits,
- wherein when the modulation scheme is 16-Quadrature Amplitude Modulation (16-QAM) and the coding rate includes one of ⅓ and 5/12, the bit-mapping table is defined as:

| 16-QAM Output bit number | | | | | | | |
|---|---|---|---|---|---|---|---|
| 0 | 1 | 2 | 3 | 4 | 5 | 6 | 7 |

| Input bit number | 7 | 1 | 2 | 5 | 4 | 0 | 6 | 3 | where the "output bit number" represents an output bit number d, in an interleaved codeword $v_d$ by the transmitter, and the "input bit number" represents a received substream value e in the demodulated bits $b_{e,d_0}$.

15. An apparatus for receiving data in a communication or broadcasting system, comprising:
- a receiver for receiving a signal transmitted by a transmitter;
- a demodulator for demodulating the received signal;
- a multiplexer for multiplexing the demodulated signal using a bit-mapping table that is determined based on a modulation scheme and a coding rate of the transmitter;
- a deinterleaver for deinterleaving the multiplexed bits; and
- a decoder for decoding the deinterleaved bits,
- wherein the multiplexer multiplexes the demodulated signal using a different bit-demapping scheme depending on a ratio of lowest-degree bits to all bits constituting an interleaved codeword by the transmitter.

16. An apparatus for receiving data in a communication or broadcasting system, comprising:
- a receiver for receiving a signal transmitted by a transmitter;
- a demodulator for demodulating the received signal;
- a multiplexer for multiplexing the demodulated signal using a bit-mapping table that is determined based on a modulation scheme and a coding rate of the transmitter;
- a deinterleaver for deinterleaving the multiplexed bits; and
- a decoder for decoding the deinterleaved bits,
- wherein the bit multiplexer multiplexes the demodulated signal using a different bit-demapping scheme depending on at least one of a degree distribution of a parity check matrix and positions of columns of an information part of the parity check matrix.

* * * * *